United States Patent
Kiyota

(10) Patent No.: US 7,503,710 B2
(45) Date of Patent: Mar. 17, 2009

(54) SUBSTRATE PROCESSING SYSTEM

(75) Inventor: Kenji Kiyota, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 474 days.

(21) Appl. No.: 11/437,634

(22) Filed: May 22, 2006

(65) Prior Publication Data

US 2006/0266290 A1  Nov. 30, 2006

(30) Foreign Application Priority Data

May 30, 2005  (JP) ............................. 2005-157924
May 31, 2005  (JP) ............................. 2005-159069
Jun. 2, 2005    (JP) ............................. 2005-162951

(51) Int. Cl.
  G03D 5/00   (2006.01)
  B65G 35/00  (2006.01)

(52) U.S. Cl. ...................................... 396/611; 414/152

(58) Field of Classification Search ................. 396/611; 414/150, 152, 222.01, 225.01, 935, 940; 118/58, 69

See application file for complete search history.

(56) References Cited

U.S. PATENT DOCUMENTS 5,826,129 A  10/1998  Hasebe et al.
6,126,338 A  10/2000  Akimoto

FOREIGN PATENT DOCUMENTS

JP    2919925    4/1999

*Primary Examiner*—Bot LeDynh
(74) *Attorney, Agent, or Firm*—Oblon, Spivak, McClelland, Maier & Neustadt, P.C.

(57) ABSTRACT

In the present invention, a plurality of first units capable of accommodating the substrate and a second unit are provided, in which a substrate is carried between the first unit and the second unit. The first units and the second unit are arranged side by side in a plan view, and at least one of the plurality of the first units is a processing unit for performing processing for the substrate. The plurality of first units are arranged in a line in the horizontal direction, and at least two first units adjacent to each other in the horizontal direction of the plurality of first units are movable in the horizontal direction to be able to transfer the substrate to/from the second unit. According to the present invention, the substrate processing system including a plurality of units flexibly deals with various substrate processing recipes and reduces the processing time difference among substrates and the carriage waiting time of the substrate.

13 Claims, 20 Drawing Sheets

SUBSTRATE PROCESSING SYSTEM

This application claims foreign priority based on Japanese patent applications No. 2005-157924, filed May 30, 2005, No. 2005-159069, filed May 31, 2005, and No. 2005-162951, filed Jun. 2, 2005, the contents of which are incorporated herein by reference in their entirety.

BACKGROUND OF THE INVENTION

1. Field of the Invention

The present invention relates to a substrate processing system for performing processing for a substrate.

2. Description of the Related Art

Conventionally, processing for a substrate, for example, a semiconductor wafer or the like often includes a plurality of processes, and the processing is continuously performed using a plurality of processing units. Accordingly, the substrate processing is typically performed in a substrate processing system in which a plurality of processing units are collectively installed.

For example, a substrate processing system for performing the photolithography process includes a loader/unloader section for carrying-in/out the substrate and a processing station for performing the processing for the substrate. At the central portion of the processing station, a central carrier unit is provided around which a plurality of processing unit groups are circularly arranged (Japanese Patent No. 2919925). Each of the processing unit groups is composed of a plurality of different kinds or the same kind of processing units which are multi-tiered. A plurality of substrates sequentially carried-in from the loader/unloader section are sequentially carried to predetermined processing units in the plurality of processing unit groups so that the substrate processing including the plurality of processes is continuously performed. The substrate for which the processing in the plurality of processes has been finished is returned to the loader/unloader section. According to the substrate processing system, the kinds and order of the processing units to which the substrate is carried by the central carrier unit can be changed to flexibly deal with various substrate processing recipes.

According to the above-described substrate processing system, however, the one central carrier unit is used to carry many substrates, and therefore, during carriage of one substrate, the carrier unit cannot carry another substrate in some cases. For this reason, it is difficult to carry out the substrate from the processing unit at an ideal timing at all times, thereby possibly increasing the periods of some substrates staying in the processing units to cause a processing time difference among the substrates. For example, the thermal processing time difference greatly affects the processing result of the substrates and can cause variations in quality of the substrates. Further, if the carriage waiting time of the substrate is increased, the time required for the whole processing of the substrate accordingly increases, and the increase can lead to a reduction in throughput.

Furthermore, a large central carrier unit is located at the center of the processing section, and processing unit groups are arranged around the carrier unit in a manner to keep an operation space for a carrier arm in the conventional substrate processing system. Therefore, a relatively large space is required for the processing station, resulting in a large substrate processing system as a whole.

SUMMARY OF THE INVENTION

The present invention has been developed in consideration of the above points, and its object is to flexibly deal with various processing recipes for substrates, reduce the processing time difference among substrates and carriage waiting time of the substrates, and reduce the size of the substrate processing system without using a central carrier unit as in the prior art.

A substrate processing system of the present invention includes a plurality of first units capable of accommodating a substrate and a second unit, the substrate being carried between the second unit and the first unit close thereto, wherein the first units and the second unit are arranged side by side in a plan view. At least one of the plurality of first units is a processing unit for performing processing for the substrate, and the plurality of first units are arranged in a line in the vertical direction. At least two first units adjacent to each other in the vertical direction of the plurality of first units are movable in the vertical direction to be able to transfer the substrate to/from the second unit.

According to the present invention, since the first units can vertically move to be able to transfer the substrate between at least two first units arranged in the vertical direction and the second unit, a plurality of carriage routes of the substrates are formed between the first units and the second unit. Therefore, it is possible to carry the substrates between the units in various combinations and flexibly deal with various processing recipes for the substrates even without using a central carrier unit as in the prior art. Furthermore, since there is no central carrier unit as in the prior art, it is possible to reduce the processing time difference among the substrates and carriage waiting time of the substrates. Moreover, it is possible to reduce the size of the substrate processing system by a space corresponding to the eliminated central carrier unit.

According to another aspect, a substrate processing system of the present invention includes a plurality of first units capable of accommodating a substrate and a second unit, the substrate being carried between the second unit and the first unit close thereto. The first units and the second unit are arranged side by side in a plan view. Further, at least one of the plurality of first units is a processing unit for performing processing for the substrate. The plurality of first units are arranged in a line in the horizontal direction, and at least two first units adjacent to each other in the horizontal direction of the plurality of first units are movable in the horizontal direction to be able to transfer the substrate to/from the second unit.

Also in this case, a plurality of carriage routes of the substrates are formed between the first units and the second unit. Therefore, it is possible to carry the substrates between the units in various combinations and flexibly deal with various processing recipes for the substrates even without using a central carrier unit as in the prior art. Furthermore, it is possible to reduce the processing time difference among the substrates to reduce the variations in quality of the substrates. Further, the carriage waiting time of the substrates can be reduced to improve the throughput. It is possible to reduce the size of the substrate processing system by a space corresponding to the eliminated central carrier unit.

According to still another aspect, the present invention is a substrate processing system for performing processing for a substrate, including: a first unit and a second unit each capable of accommodating the substrate, wherein at least either a plurality of the first units or a plurality of the second units are provided, wherein at least one of the first unit(s) or the second unit(s) is a processing unit for performing processing for the substrate. At least one of the first unit(s) or the second unit(s) is provided with a carrier unit for carrying the substrate between the first unit and the second unit, and at least one of the first unit(s) or the second unit(s) moves to allow the substrate to be carried by the carrier unit.

According to yet another aspect, a substrate processing system of the present invention includes a processing station including a plurality of first units, a plurality of second units, and a plurality of third units arranged in this order which are capable of accommodating the substrate. At least one of the first units, the second units, and the third units is a processing unit for performing processing for the substrate. Each of the first units is vertically movable, each of the second units is horizontally movable, and each of the third units is vertically movable. At least one of the first units, the second units, and the third units moves to allow the substrate to be transferred between at least one of the first units and at least one of the second units, and between at least one of the second units and at least one of the third units. According to this aspect, the first to the third units are arranged in a line in the processing station, in which the first and the third units vertically move and the second units horizontally move, so that the substrate can be carried between the units. Consequently, the substrate processing system can deal with various processing recipes for the substrates even without a central carrier unit as in the prior art.

DETAILED DESCRIPTION OF THE PREFERRED EMBODIMENT

Figure 1:
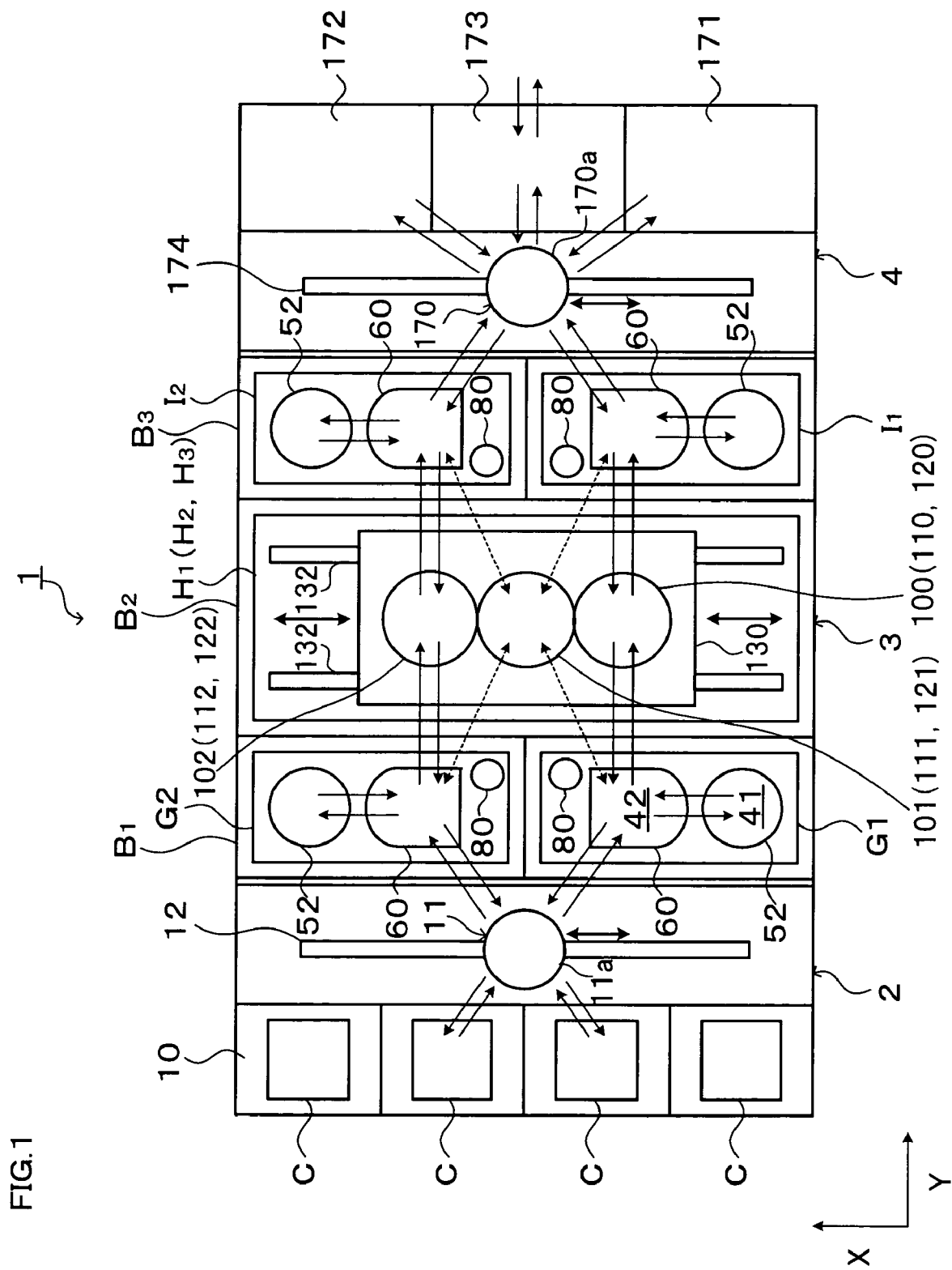
FIG. 1 is a plan view showing the outline of a configuration of a substrate processing system according to the present invention.

Hereinafter, a preferred embodiment of the present invention will be described. FIG. 1 is a plan view showing the outline of a configuration of a substrate processing system 1 according to this embodiment.

The substrate processing system 1 has, as shown in FIG. 1, a configuration in which, for example, a cassette station 2, as a carry-in section or a loader/unloader section, for carrying, for example, 25 wafers per cassette as a unit from/to the outside into/from the substrate processing system 1 and carrying the wafers W into/out of cassettes C; a processing station 3 provided adjacent to the cassette station 2 and including a plurality of units for performing various kinds of processing or treatments in the photolithography process; and an interface section 4 for transferring the wafers W to/from an aligner (not shown) provided adjacent to the processing station 3, are integrally connected together. The cassette station 2, the processing station 3, and the interface section 4 are connected in series in a Y-direction (a right-to-left direction in FIG. 1).

In the cassette station 2, a cassette mounting table 10 is provided on which a plurality of cassettes C can be mounted in an X-direction (a top-to-bottom direction in FIG. 1). The cassette C can house a plurality of wafers W arranged in the vertical direction. On the processing station 3 side in the cassette station 2, a wafer carrier 11 is provided which carries the wafer W between the cassette C and the processing station 3. The wafer carrier 11 is movable on a carrier path 12 formed along, for example, the X-direction. The wafer carrier 11 has, for example, a holding portion 11a for holding the wafer W, the holding portion 11a being movable in the vertical direction and extensible in the horizontal direction. This allows the wafer carrier 11 to access each of the cassettes C arranged in the X-direction and the units in a later-described first block B1 in the processing station 3 and carry the wafer W to them.

The processing station 3 adjacent to the cassette station 2 includes, for example, three blocks B1, B2, and B3 each including a plurality of units. In the processing station 3, for example, the first block B1, the second block B2, and the third block B3 are arranged in this order from the cassette station 2 side toward the interface section 4 side.

In the first block B1, for example, two unit groups G1 and G2 are located which are arranged side by side, for example, along the X-direction.

Figure 2:
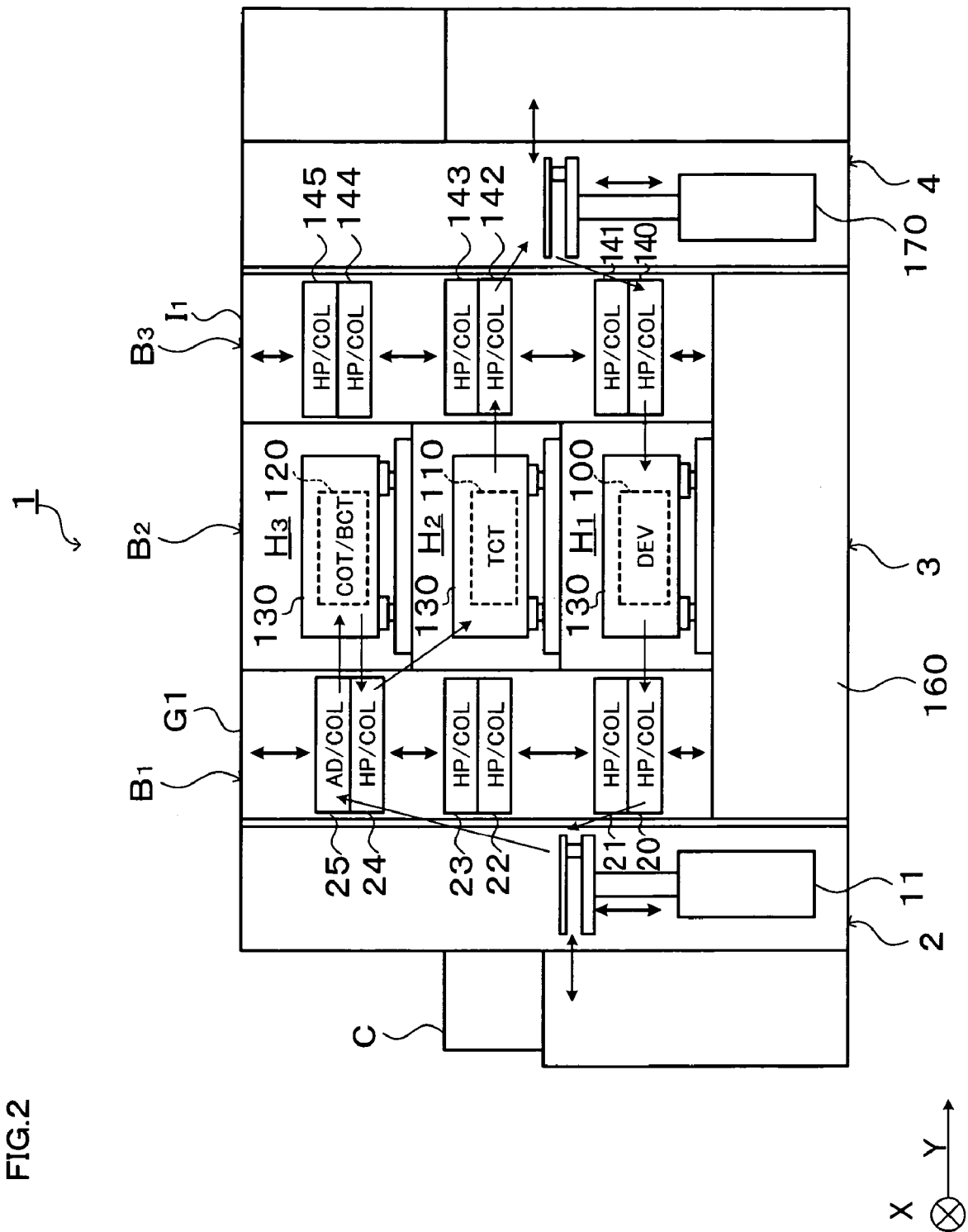
FIG. 2 is a side view showing the outline of the configuration of the substrate processing system in FIG. 1.

As shown in FIG. 2, in the first unit group G1, for example, a plurality of thermal processing units as a plurality of first units (or second units) are tiered. In the first unit group G1, for example, heating/cooling units 20, 21, 22, 23, and 24 each for performing heating processing and cooling processing for the wafer W and an adhesion/cooling unit 25 for performing adhesion treatment and cooling processing for the wafer W are six-tiered in order from the bottom. For example, two units adjacent in the vertical direction, that is, the heating/cooling units 20 and 21, the heating/cooling units 22 and 23, and the heating/cooling unit 24 and the adhesion/cooling unit 25 are integrated in pairs respectively.

Figure 3:
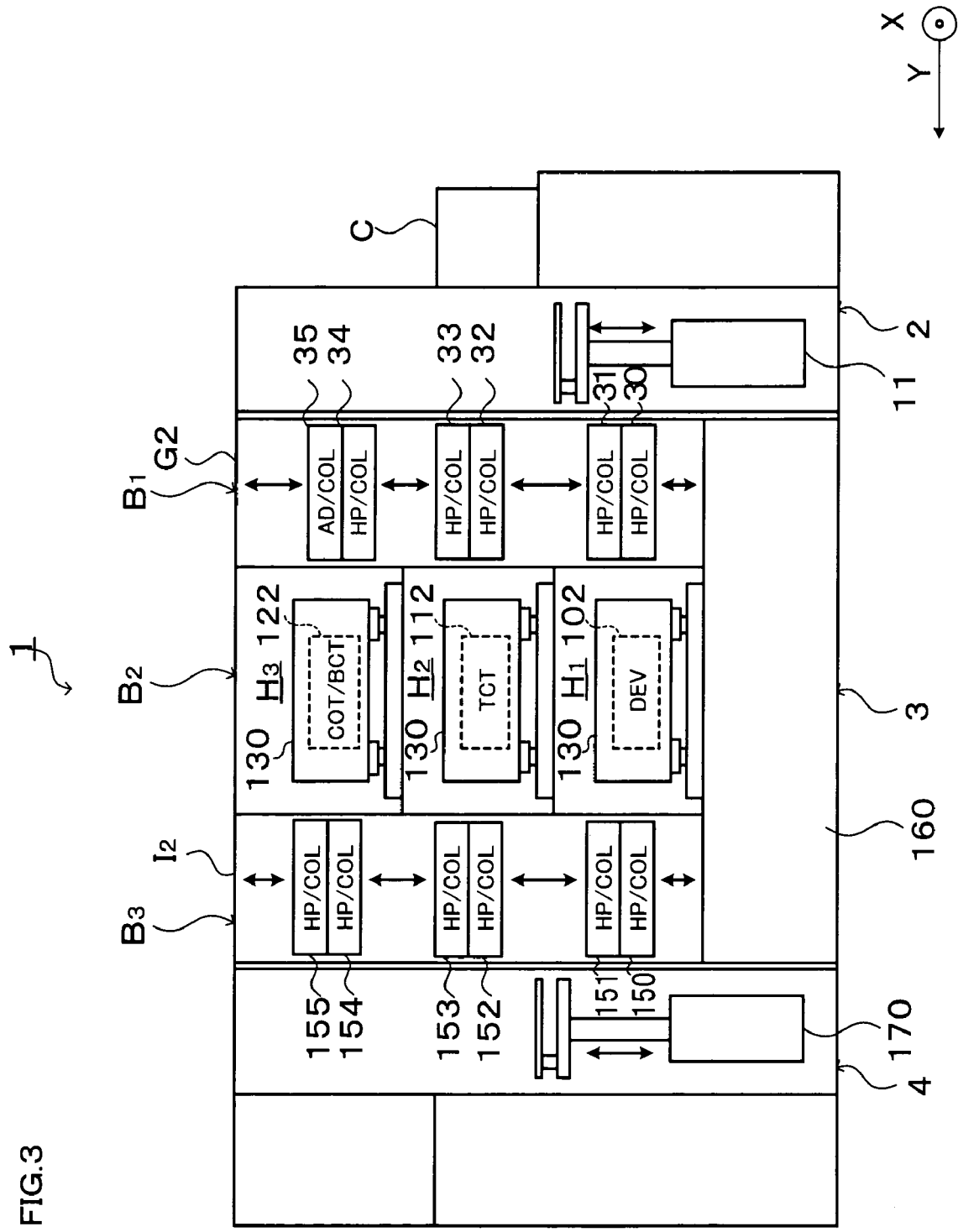
FIG. 3 is a rear view showing the outline of the configuration of the substrate processing system in FIG. 1.

In the second unit group G2, for example, heating/cooling units 30, 31, 32, 33, and 34 and an adhesion/cooling unit 35 as first units (or second units) are six-tiered in order from the bottom as in the first unit group G1 as shown in FIG. 3.

Figure 4:
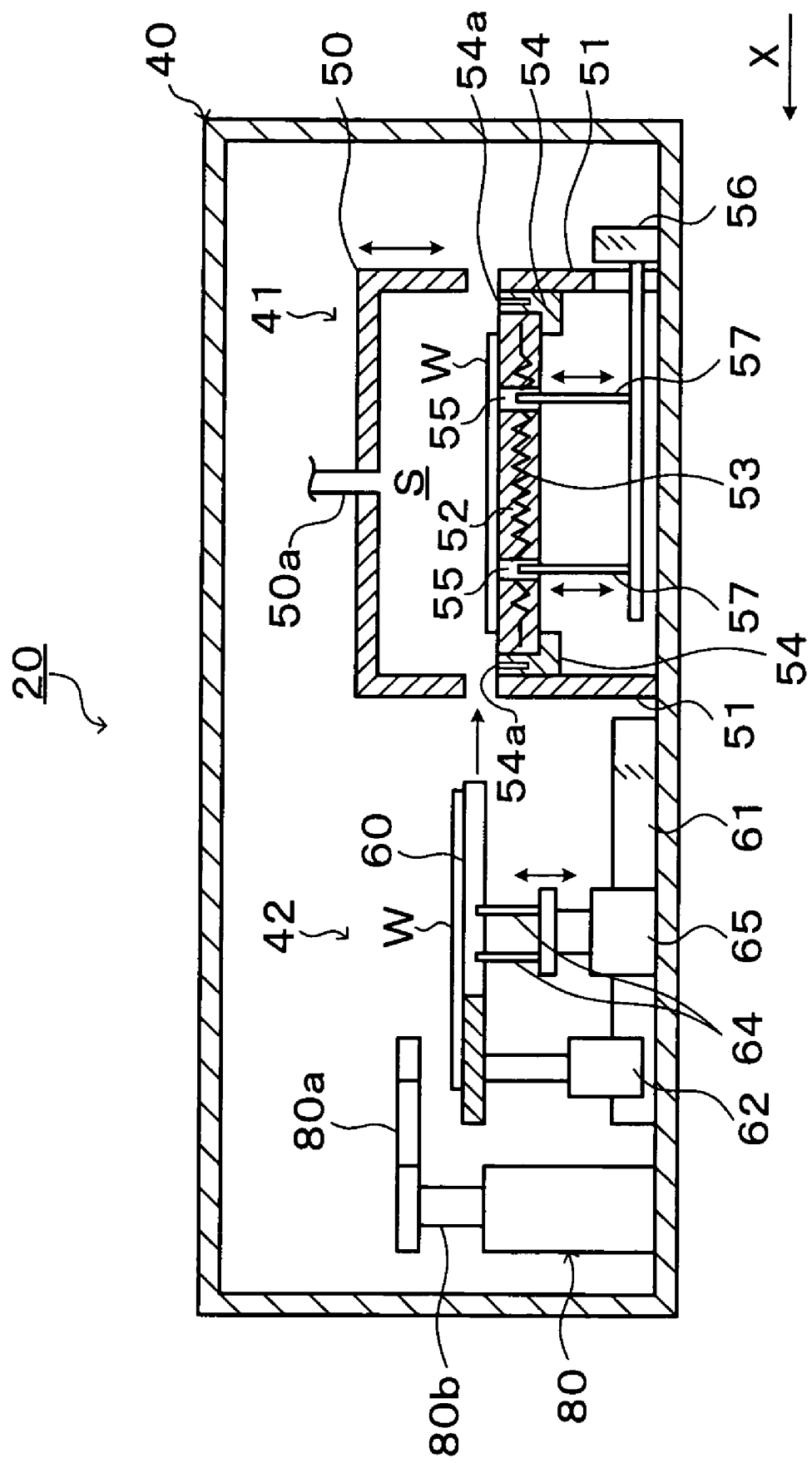
FIG. 4 is a longitudinal-sectional view showing the outline of a configuration of a heating/cooling unit.

The configuration of the heating/cooling unit 20 in the first unit group G1 is described here. The heating/cooling unit 20 comprises, as shown in FIG. 4, a heating section 41 for performing heating processing for the wafer W and a cooling section 42 for performing cooling processing for the wafer W in a housing 40. The heating section 41 and the heating section 42 are arranged along the X-direction, the cooling section 42 being located on the inner side (on the positive direction side in the X-direction) in the processing station 3 and the heating section 41 being located on the outer side (on the negative direction side in the X-direction) in the processing station 3 as shown in FIG. 1.

The heating section 41 includes, as shown in FIG. 4, a lid body 50 which is located on the upper side and vertically movable and a heating plate accommodating section 51 which is located on the lower side and united with the lid body 50 to form a processing chamber S. The lid body 50 is formed in a substantially cylindrical shape with a bottom face open, and formed with an exhaust portion 50a at the center.

At the center of the heating plate accommodating section 51, a heating plate 52 is provided which heats the wafer W mounted thereon. The heating plate 52 has a substantially disk shape with a large thickness. Inside the heating plate 52, a heater 53 is embedded which generates heat by power feeding. The heat generated by the heater 53 can be used to heat the wafer W on the heating plate 52. The heating plate 52 is supported by an annular supporting ring 54 and secured to the heating plate accommodating section 51 via the supporting ring 54.

The upper surface of the supporting ring 54 is formed with a blow-pout port 54a for jetting, for example, an inert gas toward the inside of the processing chamber S.

Near the central portion of the heating plate 52, through holes 55 are formed penetrating the heating plate 52 in the thickness direction. In the through holes 55, first raising and lowering pins 57 are located which are raised and lowered by a raising and lowering drive mechanism 56 such as a cylinder, so that the first raising and lowering pins 57 can project to a position above the heating plate 52.

Figure 5:
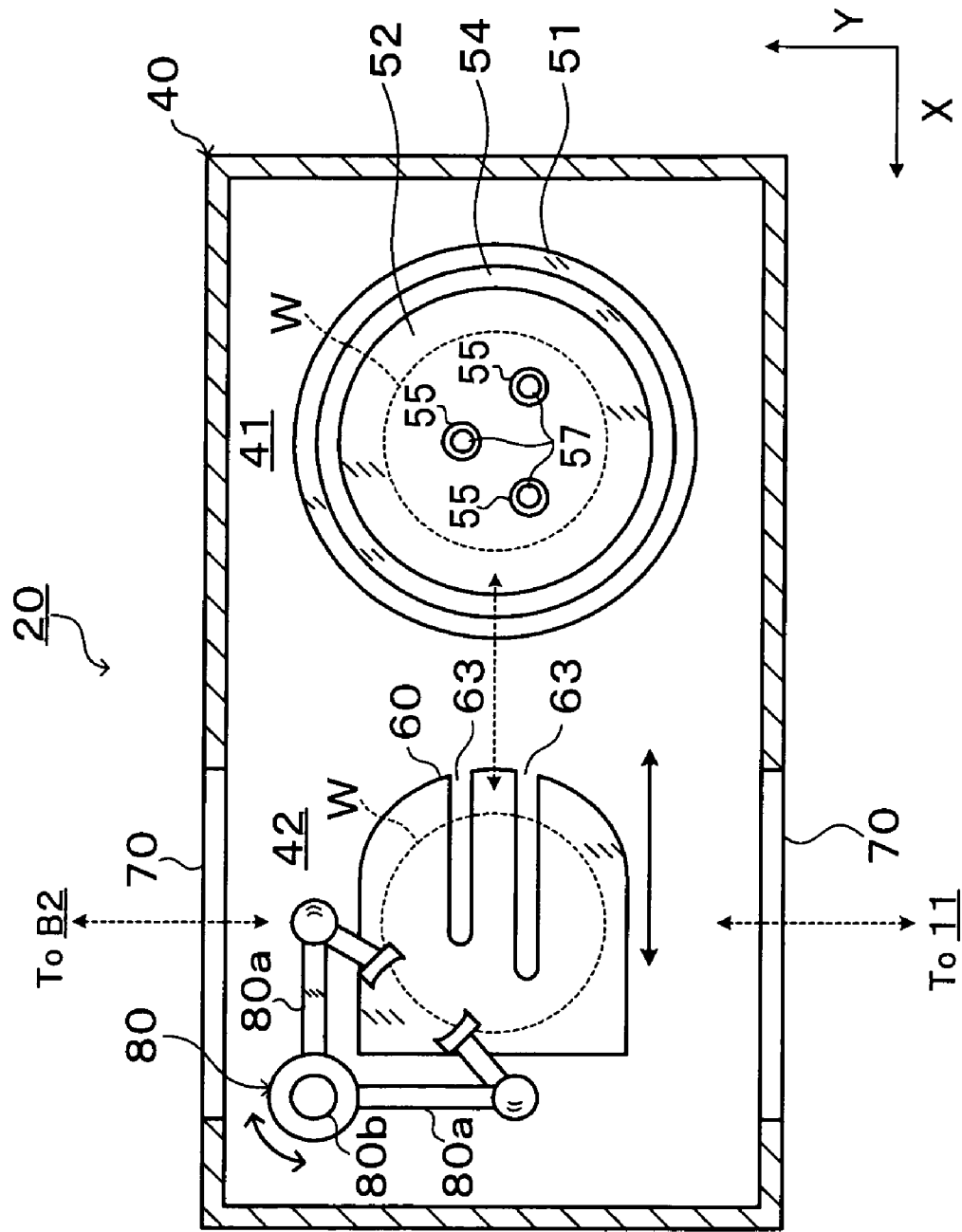
FIG. 5 is a transverse-sectional view showing the outline of the configuration of the heating/cooling unit.

In the cooling section 42 adjacent to the heating section 41, for example, a cooling plate 60 is provided which cools the wafer W mounted thereon. The cooling plate 60 has, for example, a substantially square flat-plate shape as shown in FIG. 5 with its end face on the heating section 41 side curved in an arc shape. Inside the cooling plate 60, for example, a cooling member (not shown) such as a Peltier element is embedded and can adjust the cooling plate 60 to a predetermined preset temperature.

The cooling plate 60 is attached to a rail 61 extending toward the heating section 41 side as shown in FIG. 4. The cooling plate 60 can move on the rail 61 by means of a drive unit 62. The cooling plate 60 can reciprocatingly move between a position above the heating plate 52 and the cooling section 42.

The cooling plate 60 is formed with, for example, two slits 63 along the X-direction as shown in FIG. 5. The slits 63 prevent the first raising and lowering pins 57 and the cooling plate 60 which has moved to the heating section 41 side from interfering with each other so that the first raising and lowering pins 57 can project to a position above the cooling plate 60. This makes it possible to transfer the wafer W on the cooling plate 60 to the first raising and lowering pins 57 and mount the wafer W onto the heating plate 52 from the first raising and lowering pins 57. Further it is possible to transfer the wafer W on the heating plate 52 to the first raising and lowering pins 57 and mounted the wafer W onto the cooling plate 60 from the first raising and lowering pins 57.

As shown in FIG. 4, for the slits 63 in the cooling plate 60, second raising and lowering pins 64 are provided. The second raising and lowering pins 64 can be raised and lowered by a raising and lowering drive unit 65 to project to a position above the cooling plate 60. The second raising and lowering pins 64 can lift the wafer W on the cooling plate 60 to transfer the wafer W to a later-described carrier unit 80.

As shown in FIG. 5, for example, both side surfaces in the Y-direction of the housing 40 across the cooling plate 60 are formed with carry ports 70 for carrying-in/out the wafer W.

On the side opposite to the heating plate 52 across the cooling plate 60, the carrier unit 80 is provided which carries the wafer W between the cooing plate 60 and the later-described unit in the second block B2. The carrier unit 80 is located on the positive direction side in the Y-direction of the midpoint, that is, at a position closer to the second block B2. The carrier unit 80 is, for example, a multi-joint type carrier robot. The carrier unit 80 comprises, for example, two arms 80a extensible in the horizontal direction and a rotary drive shaft 80b to which the arms 80a are attached. The carrier unit 80 can carry the wafer W to a predetermined carriage destination by grasping the wafer W by means of the two arms 80a, orienting the wafer W in a direction of the carriage destination by the rotary drive shaft 80b, and moving the wafer W back and forth in the horizontal direction by the arms 80a. The carrier unit 80 can be used to transfer the wafer W between the heating/cooling unit 20 and a solution treatment unit in the second block B2 close to the heating/cooling unit 20.

The other heating/cooling units 21, 22, 23, and 24 in the first unit group G1 have, for example, the same configuration as that of the above-described heating/cooling unit 20. The adhesion/cooling unit 25 has, for example, substantially the same configuration as that of the heating/cooling unit 20. The adhesion/cooling unit 25 includes, in place of the exhaust port 50a of the lid body 50, for example, a supply port for supplying an adhesion promoter for enhancing the adhesion of a resist solution, for example, vapor of HMDS into the processing chamber S. The adhesion/cooling unit 25 includes, in place of the blow-out port 54a of the supporting ring 54, an exhaust port for exhausting an atmosphere in the processing chamber S. The other portions are the same as those of the heating/cooling unit 20, so that the adhesion/cooling unit 25 includes a heating plate 52, a cooling plate 60, a carrier unit 80 and so on. Note that the same names and numbers as those of the above-described heating/cooling unit 20 are used for components of the thermal processing unit in the first unit group G1.

Figure 6:
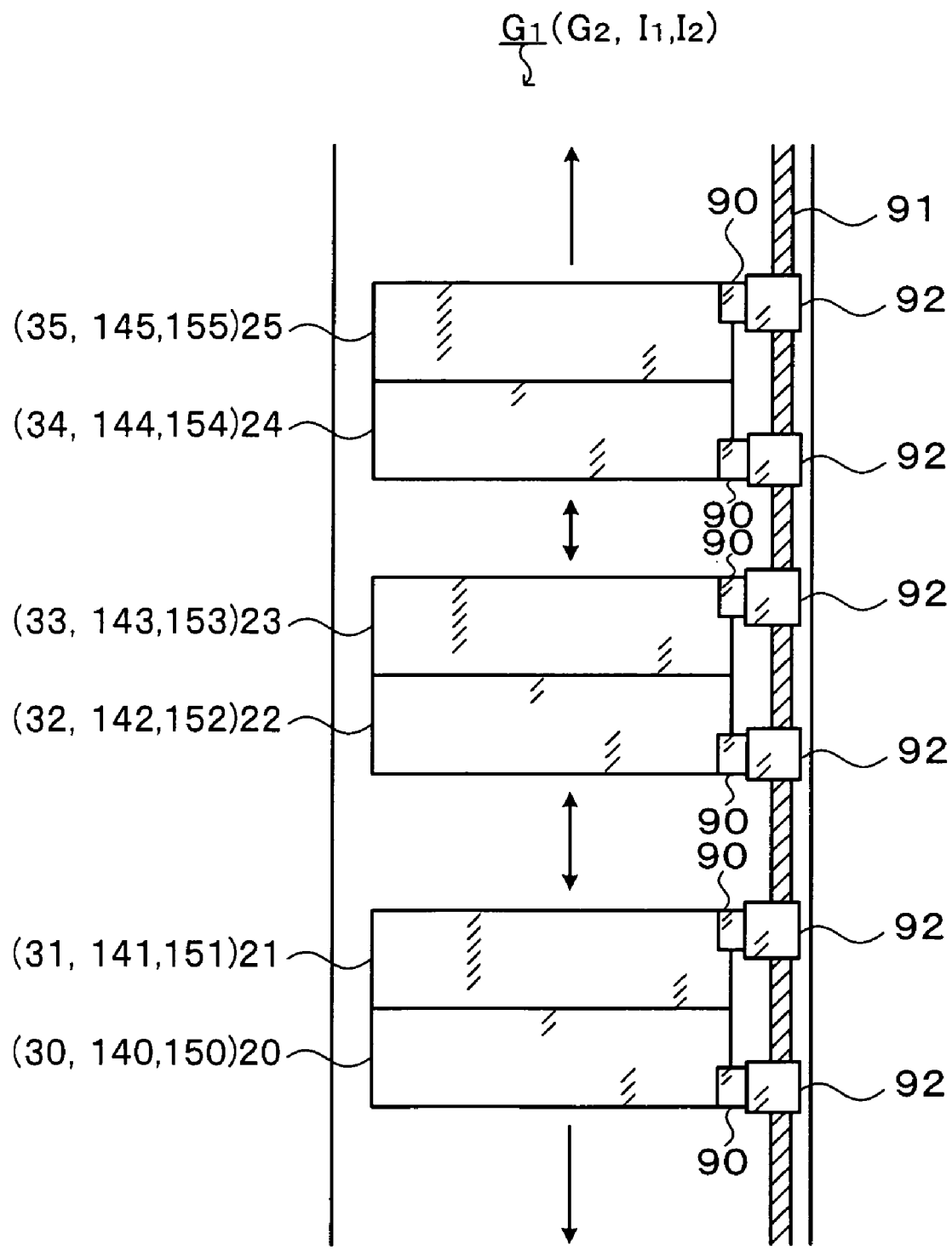
FIG. 6 is an explanatory view showing a moving mechanism of thermal processing units in first and third blocks.

As described above, the thermal processing units in the first unit group G1 are integrated such that the heating/cooling unit 20 and the heating/cooling unit 21, the heating/cooling unit 22 and the heating/cooling unit 23, and the heating/cooling unit 24 and the adhesion/cooling unit 25 are integrated in pairs respectively as shown in FIG. 6. These thermal processing units are held in pairs by holding members 90 and attached to a guide 91 extending in the vertical direction. The thermal processing units integrated in pairs can be moved in the vertical direction along the guide 91 by a drive mechanism 92. Note that the movable range of the thermal processing units will be described later. Further, the movable range of the thermal processing units in the first unit group G1 may be set so that each of later-described solution treatment units in the second block B2 can carry the wafer W to a plurality of thermal processing units in the vertical direction.

The heating/cooling units 30 to 34 and the adhesion/cooling unit 35 in the second unit group G2 have the same configuration as that of the above-described thermal processing units in the first unit group G1. Furthermore, each of the thermal processing units in the second unit group G2 has a moving mechanism shown in FIG. 6 similar to that in the first unit group G1, so that each two adjacent units are held by holding members 90 and can be moved by drive mechanisms 92 along a guide 91 in the vertical direction to a predetermined height. Note that the same names and numbers as those of the above-described heating/cooling unit 20 are used for components of the thermal processing units in the second unit group G2.

The thermal processing units in the first unit group G1 and the second unit group G2 are located such that the cooling plates 60 thereof are, for example, close and opposed to each other near the midpoint of the processing station 3 as shown in FIG. 1.

In the second block B2 of the processing station 3, as shown in FIG. 2, for example, three unit layers H1, H2, and H3 are arranged which are tiered in the vertical direction. In each of the unit layers H1 to H3, a plurality of solution treatment units are provided as second units (or first units) for performing solution treatment for the wafer W.

Figure 7:
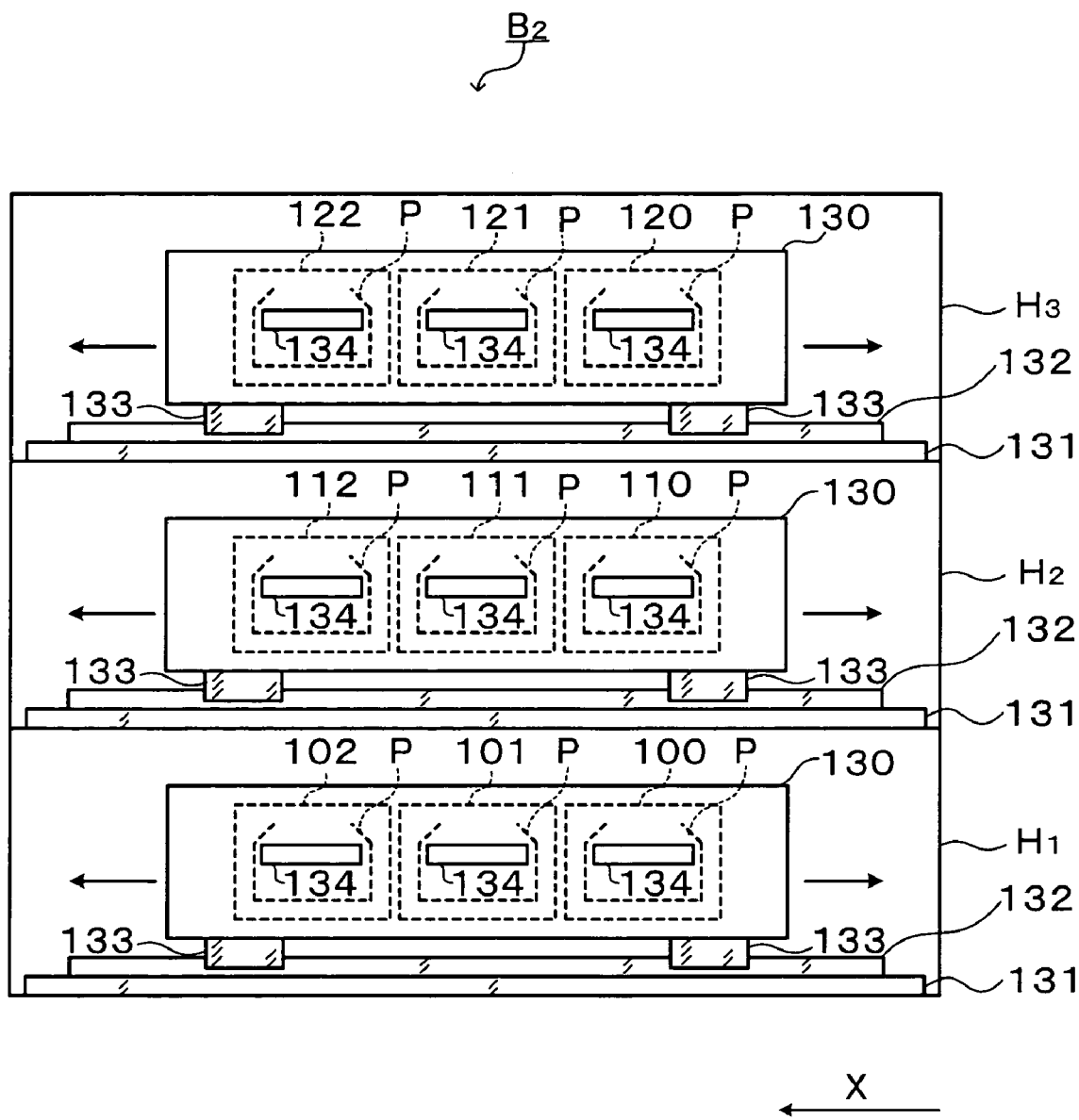
FIG. 7 is an explanatory view showing a moving mechanism of solution treatment units in a second block.

For example, in the first unit layer H1 at the lowermost tier, developing treatment units 100, 101, and 102 each for supplying a developing solution to the wafer W to perform developing treatment are provided side by side in the horizontal direction being the X-direction as shown in FIG. 7. In the second unit layer H2 at the intermediate tier, top coating units 110, 111, and 112 each for forming an antireflection film on top of the resist film are provided side by side in the horizontal direction being the X-direction. In the third unit layer H3 at the uppermost tier, for example, a resist coating unit 120 for applying the resist solution onto the wafer W, a bottom coating unit 121 for forming an antireflection film at the bottom of the resist film, and a resist coating unit 122 are provided side by side in the horizontal direction being the X-direction. In each of the solution treatment units in the second block B2, a cup P is provided for accommodating the wafer W and preventing a solution from scattering.

The developing treatment units 100 to 102 in the first unit layer H1 are housed, for example, in one housing 130 as shown in FIG. 1 and FIG. 7. The housing 130 is mounted, for example, on rails 132 formed in the X-direction on a base 131. The housing 130 is movable on the rails 132, for example, by drive mechanisms 133. This allows the developing treatment units 100 to 102 in the first unit layer H1 to move in the horizontal direction being the X-direction with respect to the thermal processing units in the adjacent first block B1 and third block B3 as shown in FIG. 1. On both sides in the Y-direction of the housing 130, carry ports 134 for the wafers W are formed, for example, for each of the developing treatment units 100 to 102 as shown in FIG. 7. The carriage of the wafer W by the carrier unit 80 of the thermal processing unit is performed through the carry ports 134. The movable range of the developing treatment units 100 to 102 may be set such that each of the thermal processing units in the first and third blocks B1 and B3 can carry the wafer W to the plurality of developing treatment units.

As shown in FIG. 7, the second unit layer H2 and the third unit layer H3 have the same configuration as that of the first unit layer H1, and the plurality of solution treatment units in each of the second unit layer H2 and the third unit layer H3 are housed in a housing 130 and can be moved in the X-direction on rails 132 by drive mechanisms 133. Note that the movable range of the solution treatment units will be described later.

In the third block B3 of the processing station 3, two unit groups I1 and I2 are provided side by side in the X-direction. In each of the unit groups I1 and I2, for example, a plurality of thermal processing units as third units are tiered.

For example, in the first unit group I1, as shown in FIG. 2, heating/cooling units 140, 141, 142, 143, 144, and 145 are six-tiered in order from the bottom. For example, in the second unit group I2, as shown in FIG. 3, heating/cooling units 150, 151, 152, 153, 154, and 155 are six-tiered in order from the bottom.

Each of the heating/cooling units 140 to 145 and 150 to 155 in the first unit group I1 and the second unit group I2 has the same configuration as that of the above-described heating/cooling unit 20 in the first block B1, and thus has a heating plate 52, a cooling plate 60 and a carrier unit 80 as another carrier unit. The carrier unit 80 allows each of the heating/cooling units in the first unit group I1 and the second unit group I2 to carry the wafer W to/from the solution treatment unit in the second block B2. Note that the same names and numbers as those of the above-described heating/cooling unit 20 are used for components of each of the heating/cooling units in the first unit group I1 and the second unit group I2.

The heating/cooling units in the first unit group I1 and the second unit group I2 are located, for example, such that the cooling plates 60 thereof are close and opposed to each other as shown in FIG. 1.

The heating/cooling units in the first unit group I1 and the second unit group I2 are integrated such that each two units adjacent in the vertical direction are integrated in a pair as shown in FIG. 2 and FIG. 3.

The heating/cooling units in the first unit group I1 and second unit group I2 have the same moving mechanisms as those of the thermal processing units in the first block B1 as shown in FIG. 6, so that each two adjacent units are held by holding members 90 and can be moved by drive mechanisms 92 along a guide 91 in the vertical direction to a predetermined height. Note that the movable range of the thermal processing units will be described later.

The movable range of the thermal processing units may be set such that each of the solution treatment units in the second block B2 can carry the wafer W to a plurality of thermal processing units in the vertical direction.

Figure 8:
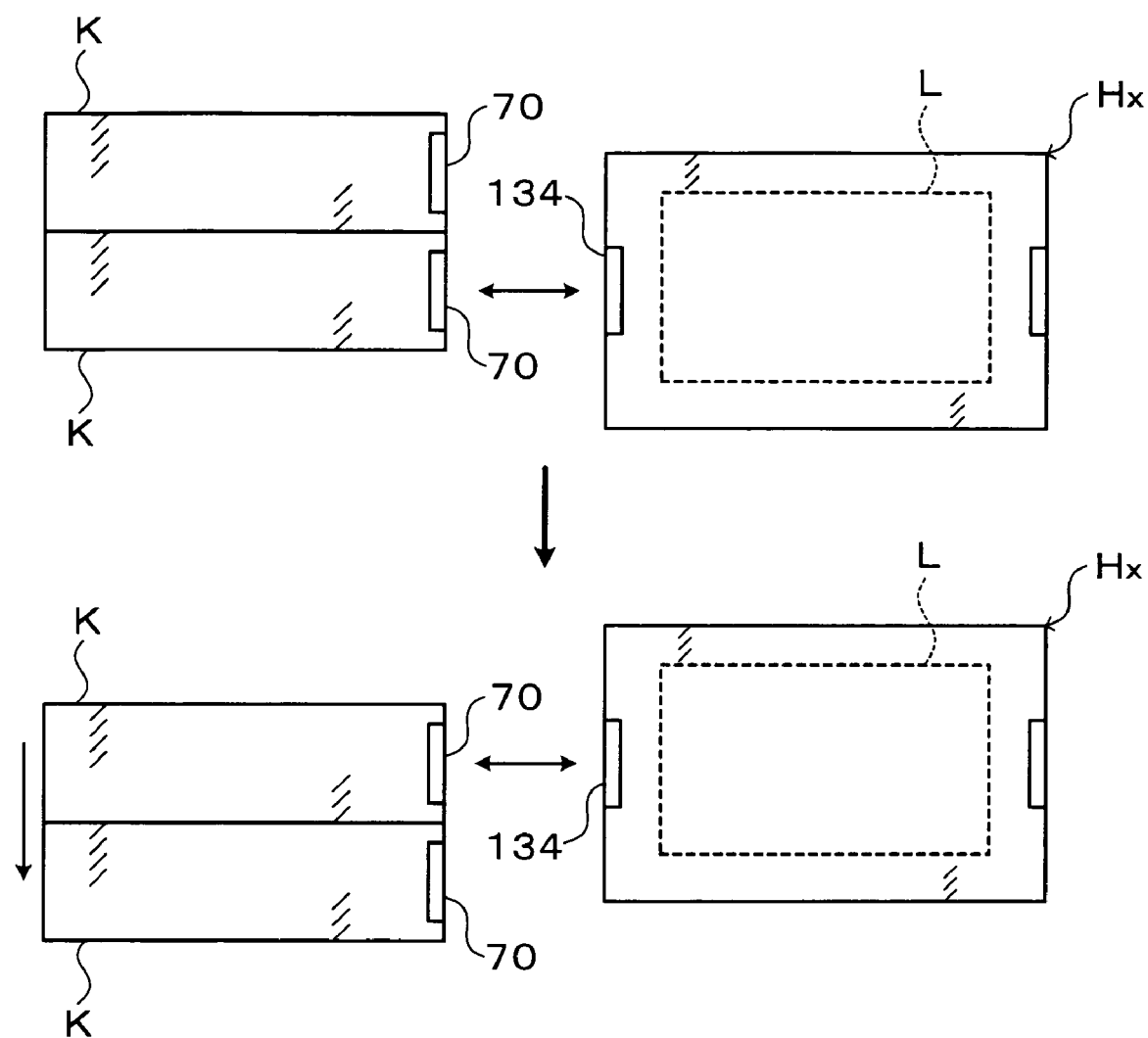
FIG. 8 is an explanatory view showing a movable range of the thermal processing units.
Figure 9:
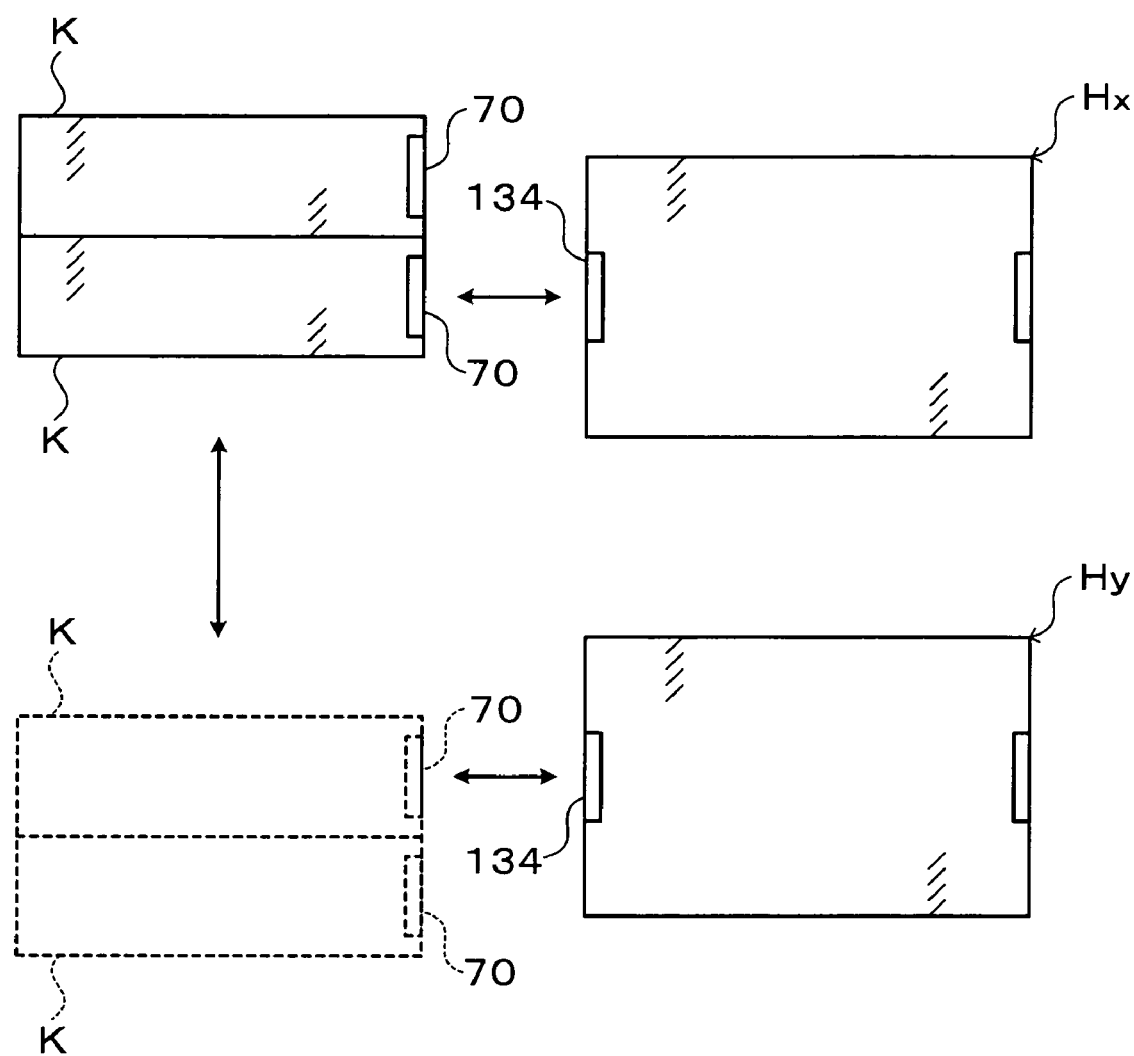
FIG. 9 is an explanatory view showing a movable range of the thermal processing units.

The movable range of the thermal processing units in the first block B1 will be described here. In this embodiment, three pairs of thermal processing units are formed as shown in FIG. 2 and FIG. 3, and the thermal processing units in pairs correspond to the unit layers H1 to H3 at the respective tiers in the second block B2. The thermal processing units in pairs integrally move up and down, and the two, upper and lower, thermal processing units in each pair can transfer the wafers W at least to/from the solution treatment units in the corresponding unit layer. For example, as shown in FIG. 8, to the position of the carry port 70 of one of the thermal processing units K in a state capable of transferring the wafer W to/from a solution treatment unit L in a unit layer Hx, the position of the carry port 70 of the other thermal processing unit K can be moved. In this embodiment, the thermal processing units are moved up and down in a wider range, so that the thermal processing units K in each pair can be moved to a unit layer Hy adjacent to the corresponding unit layer Hx to transfer the wafer W also to/from the solution treatment unit in the unit layer Hy as shown in FIG. 9.

For example, the heating/cooling units 20 and 21 at the lower tier in the first unit group G1 shown in FIG. 2 can vertically move from the first unit layer H1 to the second unit layer H2 to transfer the wafers W to/from the solution treatment units in the first unit layer H1 and the second unit layer H2. The heating/cooling units 22 and 23 at the intermediate tier can vertically move from the second unit layer H2 to the first unit layer H1 or to the third unit layer H3 to transfer the wafers W to/from the solution treatment units in all of the unit layers. Further, the heating/cooling unit 24 and the adhesion/cooling unit 25 at the upper tier can vertically move from the third unit layer H3 to the second unit layer H2 to transfer the wafers W to/from the solution treatment units in the third unit layer H3 and the second unit layer H2. In this manner, the thermal processing units in each pair can carry the wafers W at least to two, upper and lower, unit layers.

Note that the movable range of the thermal processing units in each pair in the second unit group G2 of the first block B1 is the same as that of the thermal processing units in the first unit group G1, and can carry the wafers W at least to two, upper and lower, unit layers.

Next, the movable range of the solution treatment units in the second block B2 will be described. The solution treatment units in each unit layer can horizontally move so that at least two solution treatment units adjacent to each other in the X-direction in each unit layer can transfer the wafers W to/from a common thermal processing unit in the first block B1. For example, to the position of the carry port of the solution treatment unit in a state capable of transferring the wafer W to/from a certain thermal processing unit, the position of the carry port of the solution treatment unit adjacent thereto can be moved.

Figure 10A:
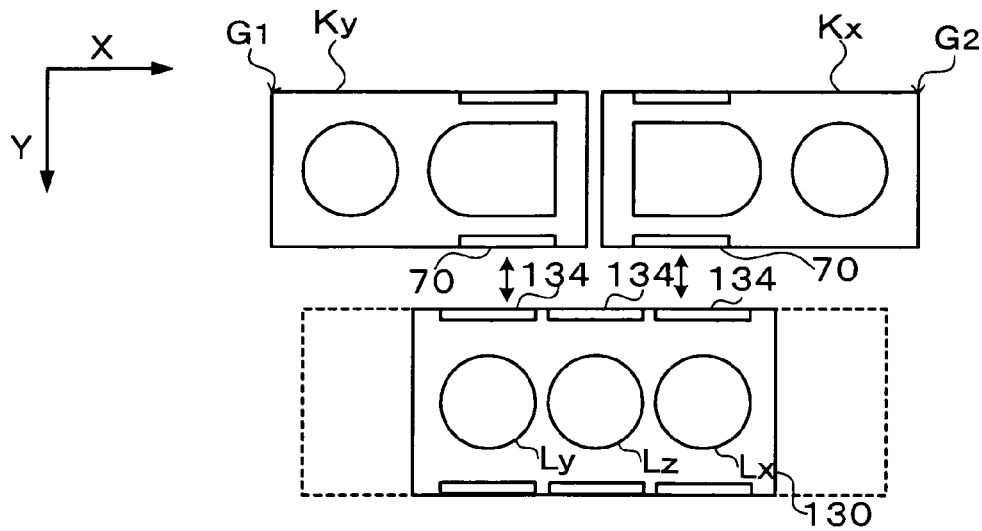
FIGS. 10A, 10B, and 10C are explanatory views each showing a movable range of solution treatment units.

When the housing 130 is located at the midpoint in the X-direction in the processing station 3 as shown in FIG. 10A, a solution treatment unit Lx at the end on the positive direction side in the X-direction is located in front of a thermal processing unit Kx in the second unit group G2, in which the carry ports 70 and 134 are opposed to each other so that the wafer W can be transferred between the solution treatment unit Lx and the thermal processing unit Kx. Further, in this event, a solution treatment unit Ly at the end on the negative direction side in the X-direction is located in front of a thermal processing unit Ky in the first unit group G1, in which the carry ports 70 and 134 are opposed to each other so that the wafer W can be transferred between the solution treatment unit Ly and the thermal processing unit Ky (FIG. 10A).

Figure 10B:
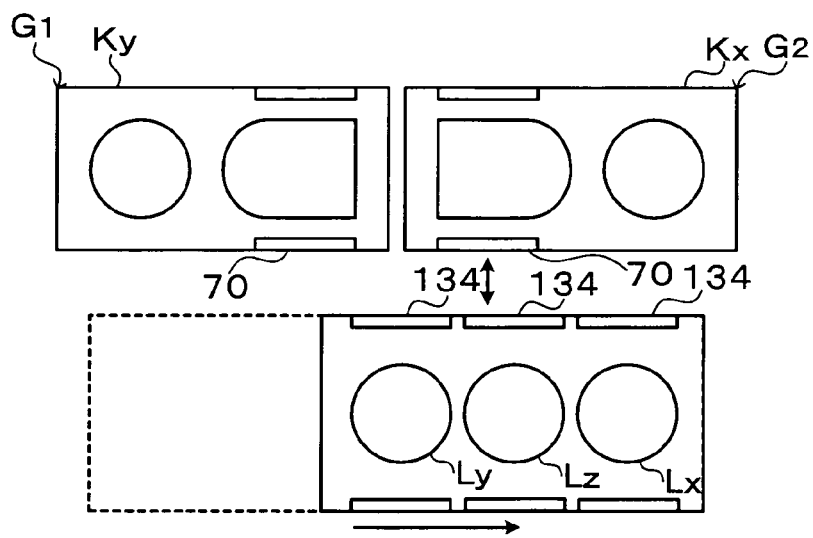
Figure 10C:
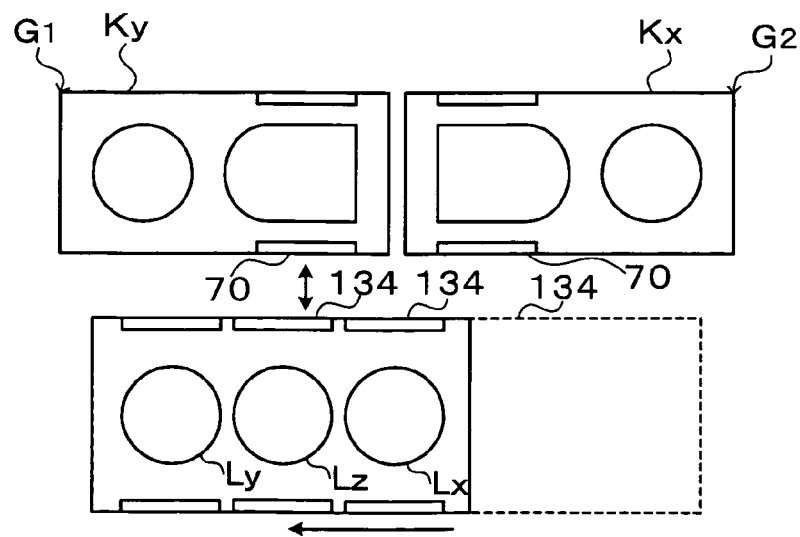

The movement of the housing 130 in the positive direction side in the X-direction allows a solution treatment unit Lz at the center to move to a position in front of the thermal processing unit Kx in the second unit group G2, in which the carry ports 70 and 134 are opposed to each other so that the wafer W can be transferred between the solution treatment unit Lz and the thermal processing unit Kx (FIG. 10B). The movement of the housing 130 in the negative direction side in the X-direction allows the solution treatment unit Lz to move, for example, to a position in front of the thermal processing unit Ky in the first unit group G1, in which the carry ports 70 and 134 are opposed to each other so that the wafer W can be transferred between the solution treatment unit Lz and the thermal processing unit Ky (FIG. 10C). In this manner, the movement of the housing 130 allows the two solution treatment units Lx and Lz to transfer the wafer W to/from the thermal processing unit Kx and the two solution treatment units Ly and Lz to transfer the wafer W to/from the thermal processing unit Ky.

As for the thermal processing units in the third block B3, similarly to the above-described thermal processing units in the first block B1, the thermal processing units in each pair can move between at least to two, upper and lower, unit layers so as to transfer the wafers W to/from the solution treatment units in the two, upper and lower, unit layers.

Figure 11:
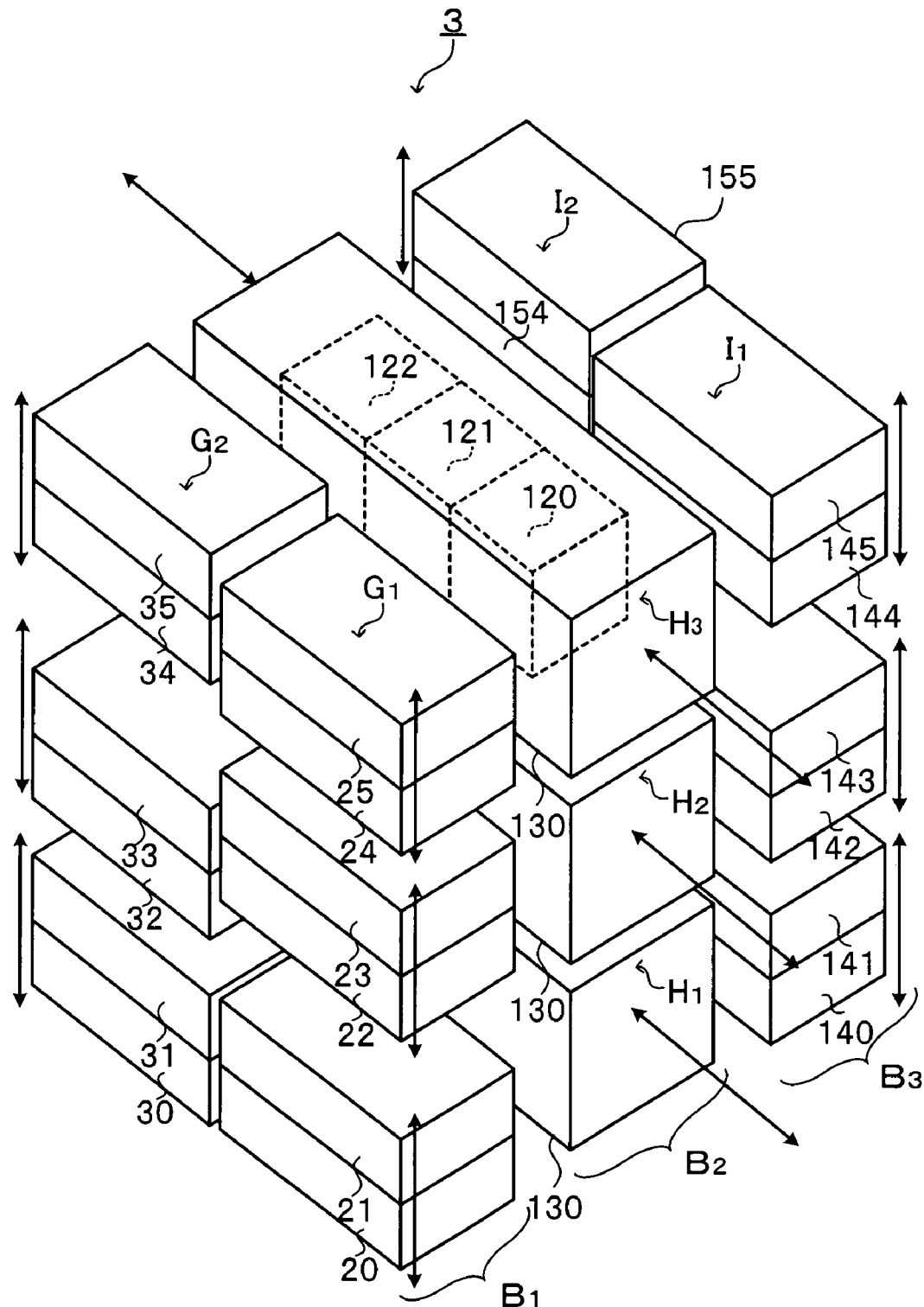
FIG. 11 is an explanatory view showing a moving direction of the units in the first to third blocks.

As described above, in the processing station 3, the thermal processing units in the first block B1 and the thermal processing units in the third block B3 can move up and down as shown in FIG. 11. Further, the solution treatment units in the second block B2 can move horizontally in the X-direction in a unit of the housing 130 in each of the layers H1 to H3. In the thermal processing units in the first block B1 and the third block B3, the carrier units 80 are provided for carrying the wafers W to/from the solution treatment units in the second block B2. This configuration enables the units in the adjacent blocks to move relative to each other and to carry the wafers W between arbitrary units, between the first block B1 and the second block B2, and between the second block B2 and the third bock B3.

At the bottom of the processing station 3, as shown in FIG. 2, an electronics and chemicals chamber 160 is provided in which supply sources of various kinds of treatment solutions to be supplied to the solution treatment units in the second block B2, power supplies and so on for the units in the blocks B1 to B3.

On the processing station 3 side in the interface section 4, for example, a wafer carrier 170 is provided as shown in FIG. 1. On the positive direction side in the Y-direction in the interface section 4, edge exposure units 171 and 172 each for selectively exposing only the outer peripheral portion of the wafer W, and a transfer cassette 173 for transferring the wafer W to/from the aligner (not shown) are provided side by side in the X-direction. The transfer cassette 173 is provided between the edge exposure units 171 and 172.

The wafer carrier 170 is movable on a carrier path extending, for example, in the X-direction. The wafer carrier 170 has a holding portion 170a for holding the wafer W, the holding portion 170a being movable in the vertical direction and extensible in the horizontal direction. The wafer carrier 170 can access the thermal processing units in the third block B3 in the processing station 3, the edge exposure units 171 and 172, and the transfer cassette 173, and carry the wafer W to them.

Next, the processing process for the wafer W performed in the substrate processing system 1 configured as described above will be described.

First of all, an unprocessed wafer W in the cassette C is carried by the wafer carrier 11 as shown in FIG. 1 in sequence into the first block B1 in the processing station 3. For example, the wafer W is carried from the adhesion/cooling unit 25 in the first unit group G1 to the adhesion/cooling unit 35 in the second unit group G2. Note that the wafer W may be carried to the adhesion/cooling unit which is unoccupied at that point in time of carriage.

For example, the wafer W carried into the adhesion/cooling unit 25 is first adjusted to a predetermined temperature by the cooling plate 60 and then carried from the cooling plate 60 to the heating plate 52. The wafer W is heated to a predetermined temperature on the heating plate 52 and coated with vapor of HMDS. Thereafter, the wafer W is returned to the cooling plate 60 and carried by the carrier unit 80 to, for example, the resist coating unit 120 (shown by an arrow in FIG. 2) in the third unit layer H3 on the upper tier in the second block B2. Note that the wafer W may be carried to the resist coating unit 122 in the same third unit layer H3. The wafer W may be carried to the resist coating unit which is unoccupied at the point in time of carriage.

At the time of carriage, if the carriage destination, for example, the resist coating unit 120 and the adhesion/cooling unit 25 are not aligned, the adhesion/cooling unit 25 vertically moves as shown in FIG. 2 or the resist coating unit 120 horizontally moves as shown in FIG. 1, whereby the adhesion/cooling unit 25 and the resist coating unit 120 move relative to each other so that the resist coating unit 120 is within the range where the wafer W can be carried by the carrier unit 80. Note that the relative movement between the units may be achieved by movement of only one of the units or movement of both units.

In the case where the wafer W is carried to the adhesion/cooling unit 35 in the second unit group G2, the wafer W is similarly carried to the resist coating unit 120 or 122 in the second block B2 after the adhesion treatment is completed.

For example, the wafer W carried into the resist coating unit 120 is coated with a resist solution. The wafer W is thereafter carried from the resist coating unit 120, for example, to the heating/cooling unit 24 at the upper tier side in the first unit group G1 in the first block B1 as shown in FIG. 2. Note that the wafer W may be carried to another heating/cooling unit which can carry the wafer W to a top coating unit where subsequent treatment is performed, for example, the heating/cooling unit 23 at the intermediate tier in the first unit group G1 or the heating/cooling unit 33 or 34 in the second unit group G2. Alternatively, the wafer W may be carried to the heating/cooling unit in the first block B1 which is unoccupied at the point in time of carriage.

The carriage of the wafer W, for example, from the resist coating unit 120 to the heating/cooling unit 24 is performed by the carrier unit 80 of the heating/cooling unit 24. If the heating/cooling unit 24 being the carriage destination and the resist coating unit 120 are not aligned, the heating/cooling unit 24 and the resist coating unit 120 move relative to each other, whereby the heating/cooling unit 24 and the resist coating unit 120 are close to each other, and the wafer W is then carried by the carrier unit 80.

The wafer W carried, for example, into the heating/cooling unit 24 is carried from the cooling plate 60 to the heating plate 52 and pre-baked. The wafer W for which the pre-baking has been finished is returned onto the cooling plate 60. The wafer W is then carried by the carrier unit 80, for example, to the top coating unit 110 in the second unit layer H2 at the intermediate tier in the second block B2. Note that the wafer W may be carried to the another top coating unit 111 or 112 in the second unit layer H2. Alternatively, the wafer W may be carried to the top coating unit in the second block B2 which is unoccupied at the point in time of carriage.

At the time of carriage, the heating/cooling unit 24 lowers, for example, from the height of the first unit layer H1 to the height of the second unit layer H2. Further, in the second unit layer H2, for example, the top coating unit 110 which is the carriage destination is horizontally moved to a position in front of the heating/cooling unit 24, and the wafer W is then carried by the carrier unit 80.

The wafer W carried, for example, into the top coating unit 110 is coated with an antireflection solution, whereby an antireflection film is formed thereon. The wafer W is then carried from the top coating unit 110, for example, to the heating/cooling unit 142 at the intermediate tier in the first unit group I1 in the third block B3. Note that the wafer W may be carried to another heating/cooling unit which can access the top coating unit 110, for example, the heating/cooling unit 143 at the intermediate tier in the first unit group I1, or the heating/cooling unit 152 or 153 in the second unit group I2. Alternatively, the wafer W may be carried to the heating/cooling unit in the third block B3 which is unoccupied at the point in time of carriage.

The carriage of the wafer W from the top coating unit 110 to the heating/cooling unit 142 is performed by the carrier unit 80 of the heating/cooling unit 142. If the carriage destination, for example, the heating/cooling unit 142 and the top coating unit 110 are not aligned, the heating/cooling unit 142 and the top coating unit 110 move relative to each other, whereby the heating/cooling unit 142 and the top coating unit 110 are close to each other, and the wafer W is then carried by the carrier unit 80.

The wafer W carried, for example, into the heating/cooling unit 142 is carried from the cooling plate 60 to the heating plate 52 and heated. The wafer W for which heating has been finished is returned onto the cooling plate 60, and then carried to the edge exposure unit 171 by the wafer carrier 170 in the interface section 4. In the edge exposure unit 171, the outer peripheral portion of the wafer W is exposed. The wafer W is then carried by the wafer carrier 170 to the transfer cassette 173 and to the aligner (not shown) close to the interface section 4, where the wafer W is exposed.

The wafer W for which the exposure processing has been finished is returned into the transfer cassette 173 and carried by the wafer carrier 170, for example, to the heating/cooling unit 140 at the lower tier side in the first unit group I1 in the third block B3. Note that the wafer W may be carried to the other heating/cooling unit 141, 150, or 151 which can carry the wafer W to a developing treatment unit where subsequent treatment is performed. Alternatively, the wafer W may be carried to the heating/cooling unit in the third block B3 which is unoccupied at the point in time of carriage.

The wafer W carried, for example, into the heating/cooling unit 140 is carried from the cooling plate 60 to the heating plate 52 where the wafer W is subjected to post-exposure baking. The wafer W for which the post-exposure baking has been finished is returned to the cooling plate 60 and then carried by the carrier unit 80, for example, to the developing treatment unit 100 in the first unit layer H1 in the second block B2. Note that the wafer W may be carried to the other developing unit 101 or 102 in the first unit layer H1. Alternatively, the wafer W may be carried to the developing treatment unit in the second block B2 which is unoccupied at the point in time of carriage.

At the time of carriage, if the carriage destination, for example, the heating/cooling unit 140 and the developing treatment unit 100 are not aligned, the heating/cooling unit 140 and the developing treatment unit 100 move in the vertical direction and in the horizontal direction respectively, whereby the heating/cooling unit 140 and the developing treatment unit 100 are close to each other, and the wafer W is then carried by the carrier unit 80.

The wafer W carried, for example, into the developing treatment unit 100 is developed. The wafer W for which the developing treatment has been finished is carried, for example, to the heating/cooling unit 20 on the lower tier side in the first unit group G1 in the first block B1. Note that the wafer W may be carried to the other unit which can access the developing treatment unit 100, for example, the heating/cooling unit 21 on the lower tier side in the first unit group G1 or the heating/cooling unit 30 or 31 on the lower tier side in the second unit group G2. Alternatively, the wafer W may be carried to the heating/cooling unit in the first block B1 which is unoccupied at the point in time of carriage.

The carriage of the wafer W from the developing treatment unit 100 to the heating/cooling unit 20 is performed by the carrier unit 80 of the heating/cooling unit 20. If the heating/cooling unit 20 which is the carriage destination and the developing treatment unit 100 are not aligned, the heating/cooling unit 20 and the developing treatment unit 100 move relative to each other, whereby the heating/cooling unit 20 and the developing treatment unit 100 are close to each other, and the wafer W is then carried by the carrier unit 80.

The wafer W carried, for example, into the heating/cooling unit 20 is carried from the cooling plate 60 to the heating plate 52 and subjected to post-baking. The wafer W for which the post-baking has been finished is returned to the cooling plate 60 and returned to the cassette C by the wafer carrier 11 in the cassette station 2. Thus, a series of processes of photolithography end.

According to the above embodiment, the two thermal processing units in each pair of the first block B1 and the third block B3 in the processing station 3 can vertically move so as to transfer the wafers W to/from a common solution treatment unit. The two solution treatment units adjacent to each other in the second block B2 can horizontally move to transfer the wafers W to a common thermal processing unit. This configuration allows the units in the first block B1 and the units in the second block B2, and the units in the second block B2 and the units in the third block B3 are move relative to each other, so that the wafer W can be carried between the units in a number of combinations between the adjacent blocks. Therefore, carriage routes of the wafer W passing through the units in various combinations are formed in the processing station 3. As a result of this, various flows for the wafer W can be realized in the substrate processing system 1 to flexibly deal with various recipes for the wafer W. Further, a central carrier unit as in the prior art is eliminated to enable the carriage between the units to be smoothly performed, thus reducing the processing time difference among the wafers W and the difference in waiting time of the wafer W to uniformize the wafer processing and improve the throughput. In addition, a large space required for setting the central carrier unit is not necessary, so that the substrate processing system 1 can be accordingly decreased in size.

Since the carrier units 80 are provided in the thermal processing units in the first block B1 and the third block B3, the wafer W in the cassette station 2 can be linearly carried into the first block B1, the second block B2, and the third block B3, and the interface section 4 in sequence. Alternatively, the wafer W can be carried to the interface section 4 after the wafer W is reciprocated between the first block B1 and the second bock B2, or between the second block B2 and the third block B3. When the wafer W is returned from the interface section 4 to the cassette station 2, the wafer W can be similarly carried into the third block B3, the second block B2, the first block B1, and the cassette station 2 in sequence. Alternatively, the wafer W can be carried to the cassette station 2 after the wafer W is reciprocated between the third block B3 and the second bock B2, or between the second block B2 and the first block B1.

In the above-described embodiment, the plurality of solution treatment units are arranged side by side in the horizontal direction in the second block B2 to enable the plurality of solution treatment units to be moved in the horizontal direction, whereby each of the thermal processing units in the first and third blocks B1 and B3 can carry the wafer W to a plurality of solution treatment units in the horizontal direction in the second block B2. Moreover, each of the solution treatment units in the second block B2 can carry the wafer W to a plurality of thermal processing units in the horizontal direction in the first and third blocks B1 and B3.

Further, the plurality of thermal processing units in the first and third blocks B1 and B3 are tiered one on the other and configured to be able to vertically move, whereby each of the solution treatment units in the second block B2 can carry the wafer W to a plurality of thermal processing units in the vertical direction in the first and third blocks B1 and B3. In addition, each of the thermal processing units in the first and third blocks B1 and B3 can carry the wafer W to the solution treatment units in a plurality of layers in the vertical direction in the second block B2.

While the thermal processing units in each pair in the first and third blocks B1 and B3 can vertically move across the two, upper and lower, layers in above embodiment, it is only required that both of the thermal processing units in each pair can transfer the wafer W to/from the solution treatment units at least in one unit layer. Further, it is also adoptable that the thermal processing units in each pair can vertically move across all of the units layers H1 to H3 to be able to transfer the wafer W to/from the solution treatment units in all of the unit layers H1 to H3. In this case, for example, the widths in the vertical direction of the first block B1 and the third block B3 may be made larger than that of the second block B2 to ensure that the thermal processing units in a pair at the lowermost tier can transfer the wafers W to/from the solution treatment units in the unit layer H3 at the uppermost tier and the thermal processing units in a pair at the uppermost tier can transfer the wafers W to/from the solution treatment units in the unit layer H1 at the lowermost tier.

While the two adjacent solution treatment units in each unit layer in the second block B2 horizontally move to be able to transfer the wafers W to/from a common thermal processing unit in the first block B1 or the third block B3 in the above embodiment, all of the solution treatment units in each unit layer may be configured to be able to transfer the wafers W to/from a common thermal processing unit. In this case, for example, the width in the horizontal direction in the X-direction of the second block B2 may be made wider than those of the first block B1 and the third block B3 to ensure that the housing 130 can horizontally move in a wider range. In addition, it is also adoptable to ensure that the solution treatment unit at the end on the positive direction side in the X-direction can transfer the wafer W to/from the thermal processing unit in the first unit group G1 and the solution treatment unit at the end on the negative direction side in the X-direction can transfer the wafer W to/from the thermal processing unit in the second unit group G2. This configuration increases the number of combinations of units which can carry the wafer W to each other, so as to form a larger number of carriage routes of the wafer W.

Figure 12:
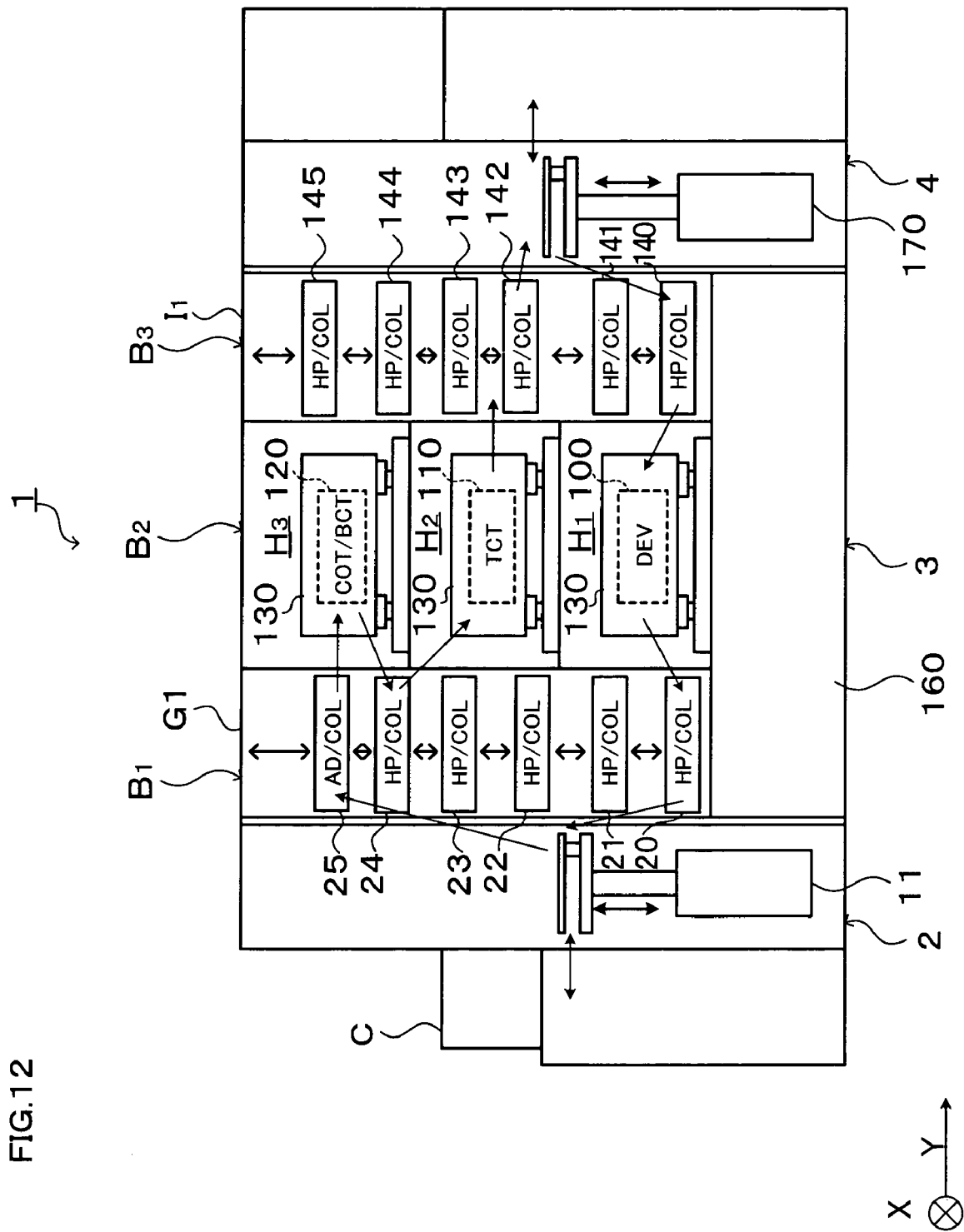
FIG. 12 is a side view showing the outline of a configuration of a substrate processing system including independently moving thermal processing units.

While the thermal processing units integrated in pairs in the first and third blocks B1 and B3 vertically move in the above embodiment, the thermal processing units may vertically move one by one as shown in FIG. 12. In this case, the degree of freedom of movement of each thermal processing unit increases, and therefore the degrees of freedom of the timing of carrying the wafer W and the carriage route of the wafer W also increase. As a result of this, variations in the carriage waiting time of the wafer W and the processing time among the wafers can be reduced.

Figure 13:
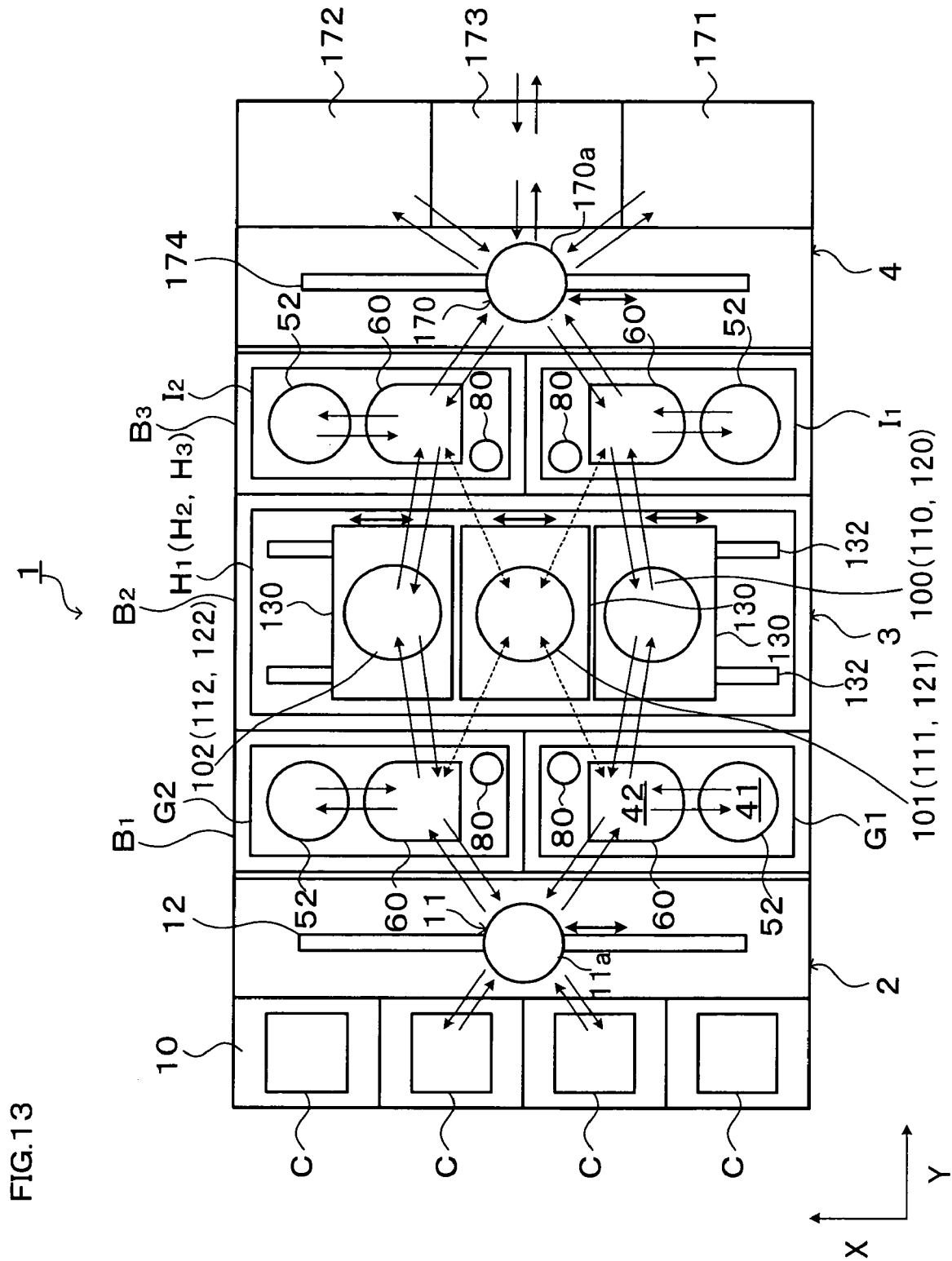
FIG. 13 is a plan view showing the outline of the configuration of the substrate processing system including the independently moving thermal processing units.

Further, while the solution treatment units in each layer in the second block B2 integrally move in the horizontal direction for each housing 130, each of the solution treatment units may individually move in the horizontal direction as shown in FIG. 13. In this case, the housing 130 is provided, for example, for each solution treatment unit. Also in this case, the degree of freedom of movement of each solution treatment unit increases, and therefore the degrees of freedom of the timing of carrying the wafer W and the carriage route of the wafer W also increase, so that the wafer W can be carried at more appropriate timing.

Figure 14:
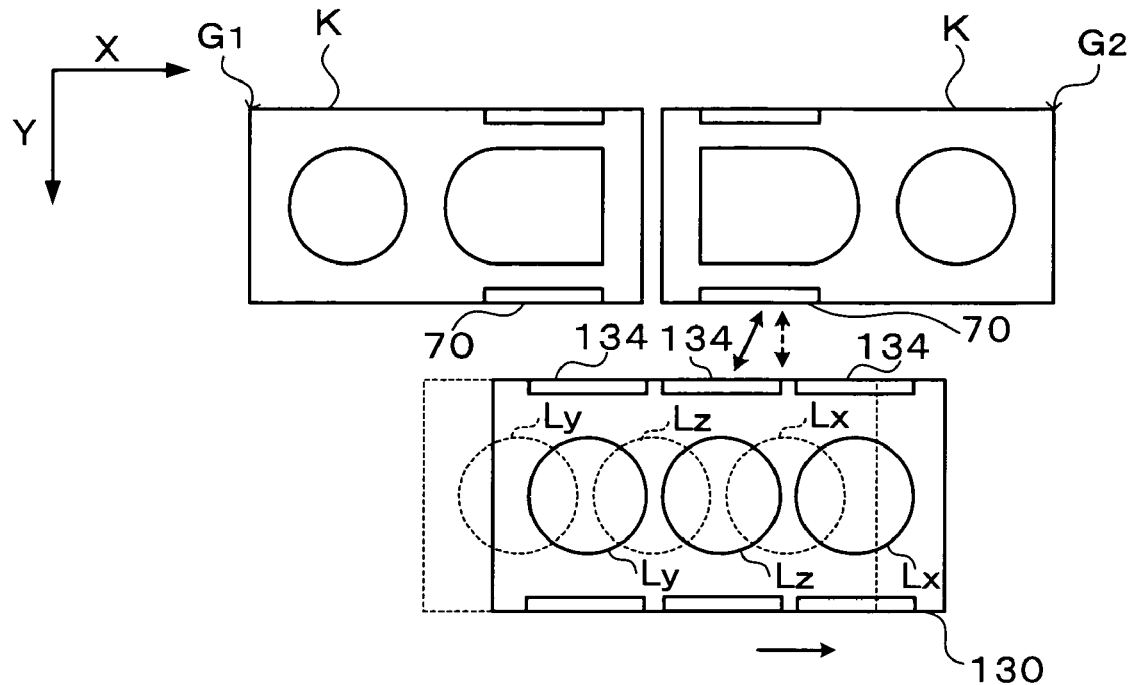
FIG. 14 is an explanatory view showing another movable range of the solution treatment units.

While each of the solution treatment units in the second block B2 moves horizontally by about a distance corresponding to one unit in the above embodiment, each of the solution treatment units Lx, Ly, and Lz may move horizontally within a distance corresponding to one unit by movement of the housing 130 as shown in FIG. 14 as long as at least two solution treatment units adjacent in the horizontal direction can transfer the wafers W to/from a common thermal processing unit within that range.

Figure 15:
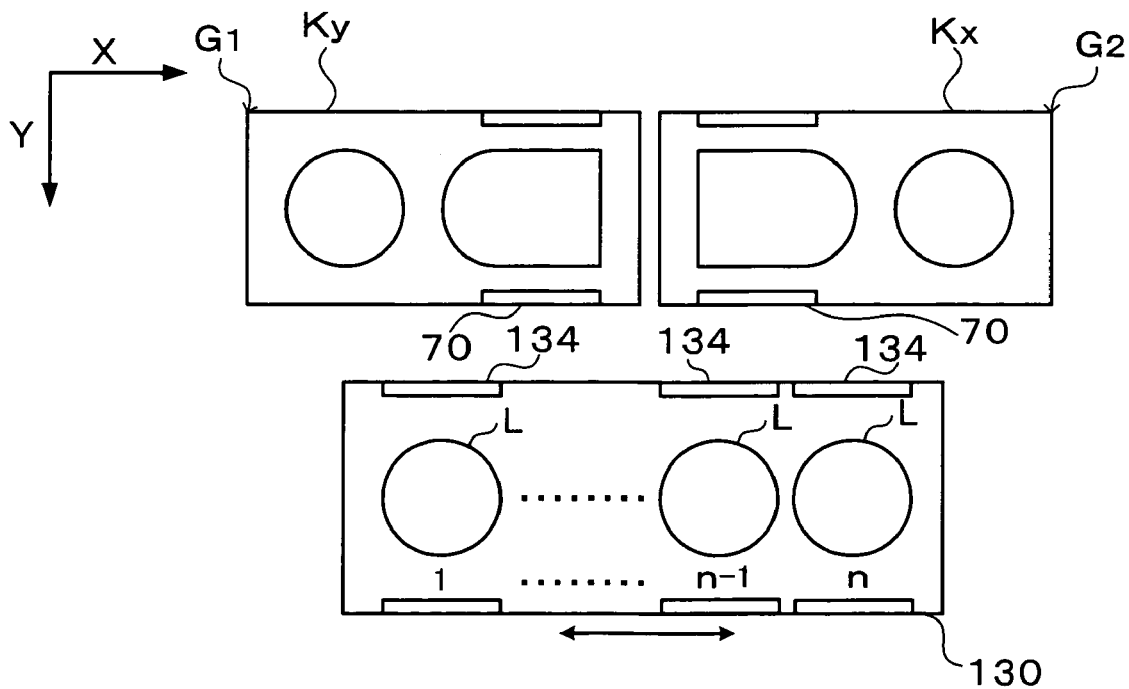
FIG. 15 is an explanatory view showing a movable range of the solution treatment units when N solution treatment units are provided.

Note that each of the solution treatment units may horizontally move by a distance corresponding to one unit or more. For example, where N (N is a natural number of two or greater) solution treatment units L of the same kind are arranged in the horizontal direction as shown in FIG. 15, the solution treatment units L may be configured to be able to integrally move in the horizontal direction by a distance corresponding to N−1 units. For example, when there are three solution treatment units, the solution treatment units may move by a distance corresponding to two units. This configuration allows all of the solution treatment units L to transfer the wafers W to/from common thermal processing units Kx and Ky. For example, the solution treatment unit at the end on the negative direction side in the X-direction can transfer the wafer W to/from the thermal processing unit Kx in the second unit group G2, and the solution treatment unit at the end on the positive direction side in the X-direction can transfer the wafer W to/from the thermal processing unit Ky in the first unit group G1.

Figure 16:
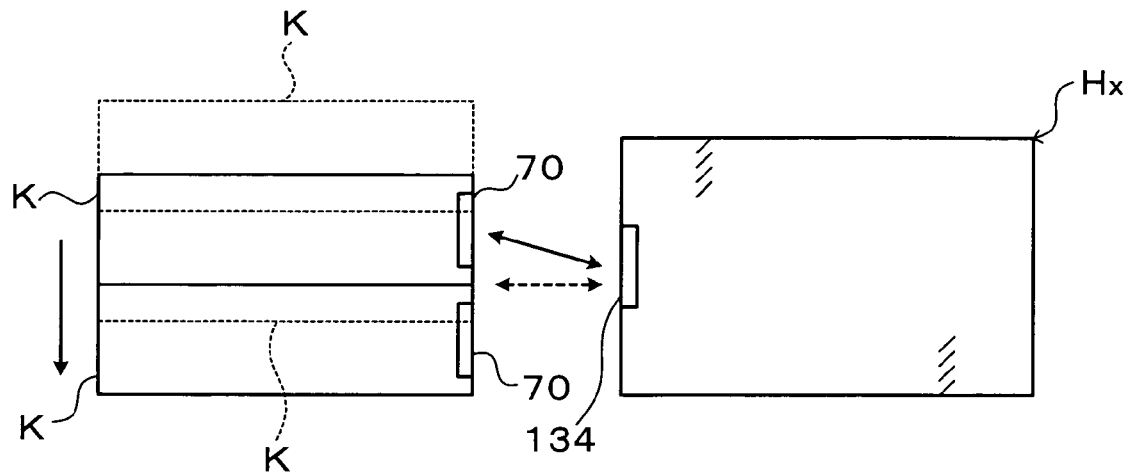
FIG. 16 is an explanatory view showing another movable range of the thermal processing units.

Further, while each of the above-described thermal processing units in the first and third blocks B1 and B3 moves vertically by about a distance corresponding to one unit, each of the thermal processing units K may move vertically within a distance corresponding to one unit as shown in FIG. 16 as long as at least two thermal processing units adjacent in the vertical direction can transfer the wafers W to/from a common solution treatment unit within that range. Note that each of the thermal processing units may vertically move by a distance corresponding to one unit or more.

Figure 17:
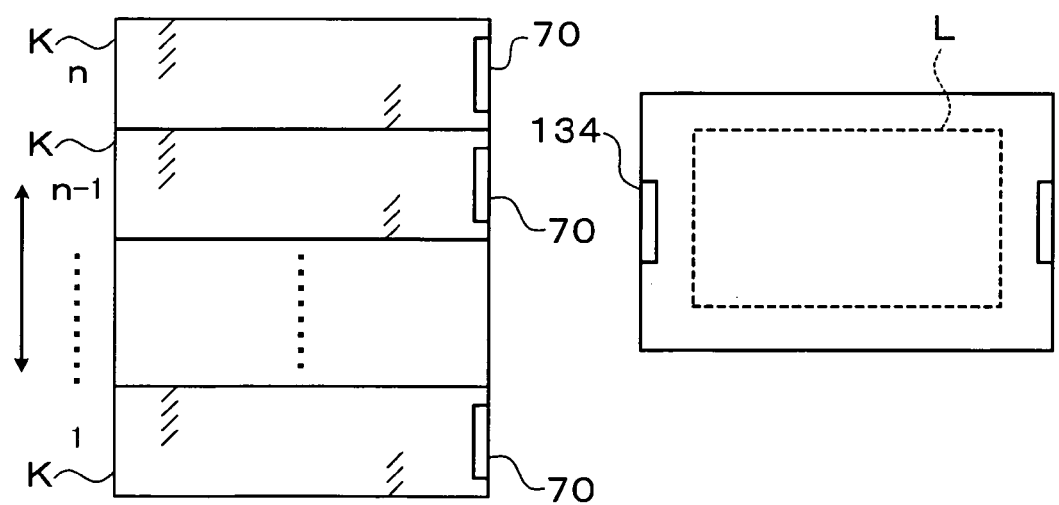
FIG. 17 is an explanatory view showing a movable range of the thermal processing units when N thermal processing units are provided.

While two thermal processing units integrally move in vertical direction in the above embodiment, if N, two or more, thermal processing units K of the same kind integrally move in vertical direction as shown in FIG. 17, the integrated thermal processing units K may be configured to be able to vertically move by a distance corresponding to N−1 units. This configuration allows all of the thermal processing units K to transfer the wafers W to/from a common solution treatment unit L.

Figure 18:
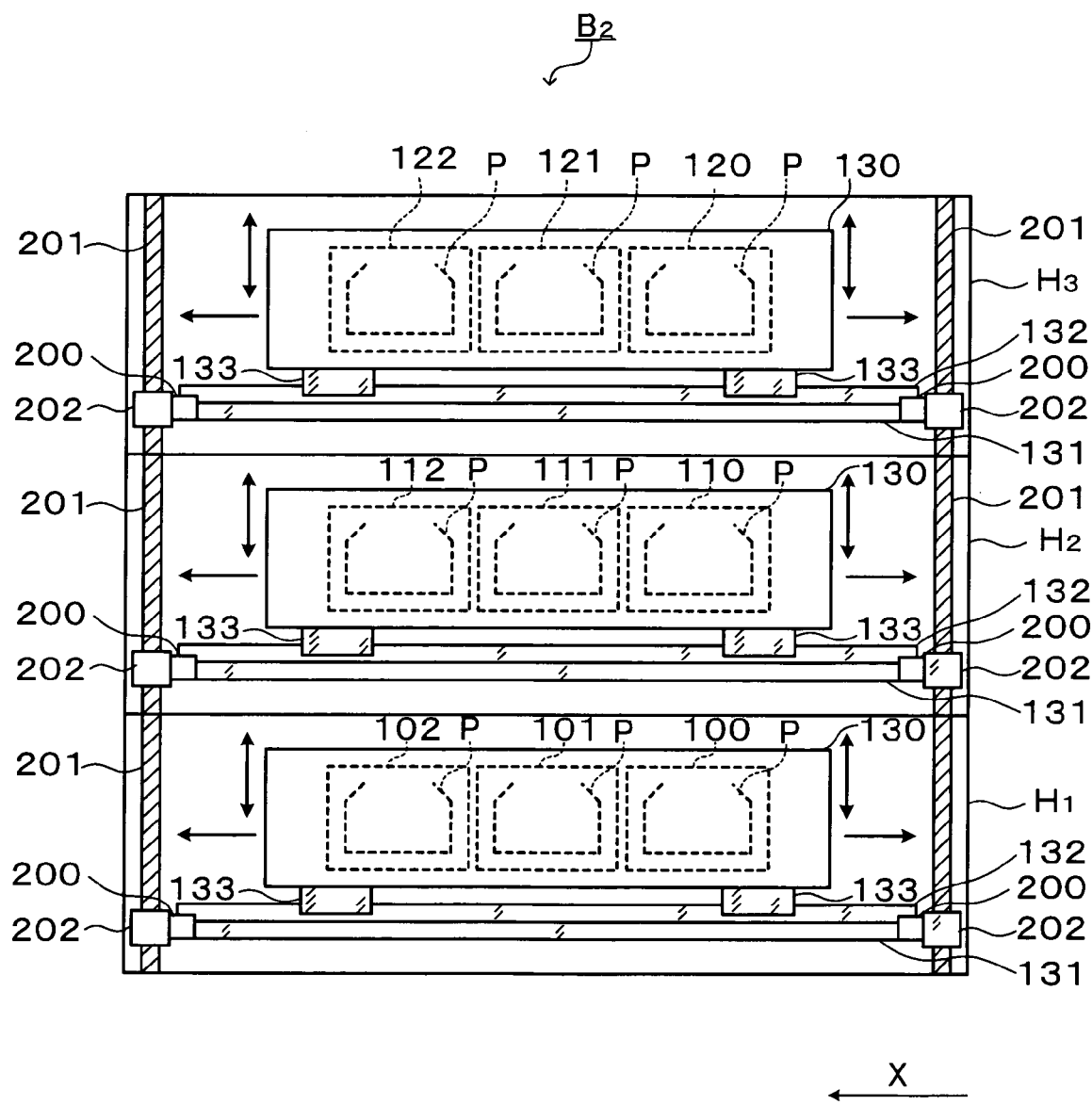
FIG. 18 is an explanatory view showing a movable mechanism of the solution treatment units in the second block which can move also in the vertical direction.
Figure 19:
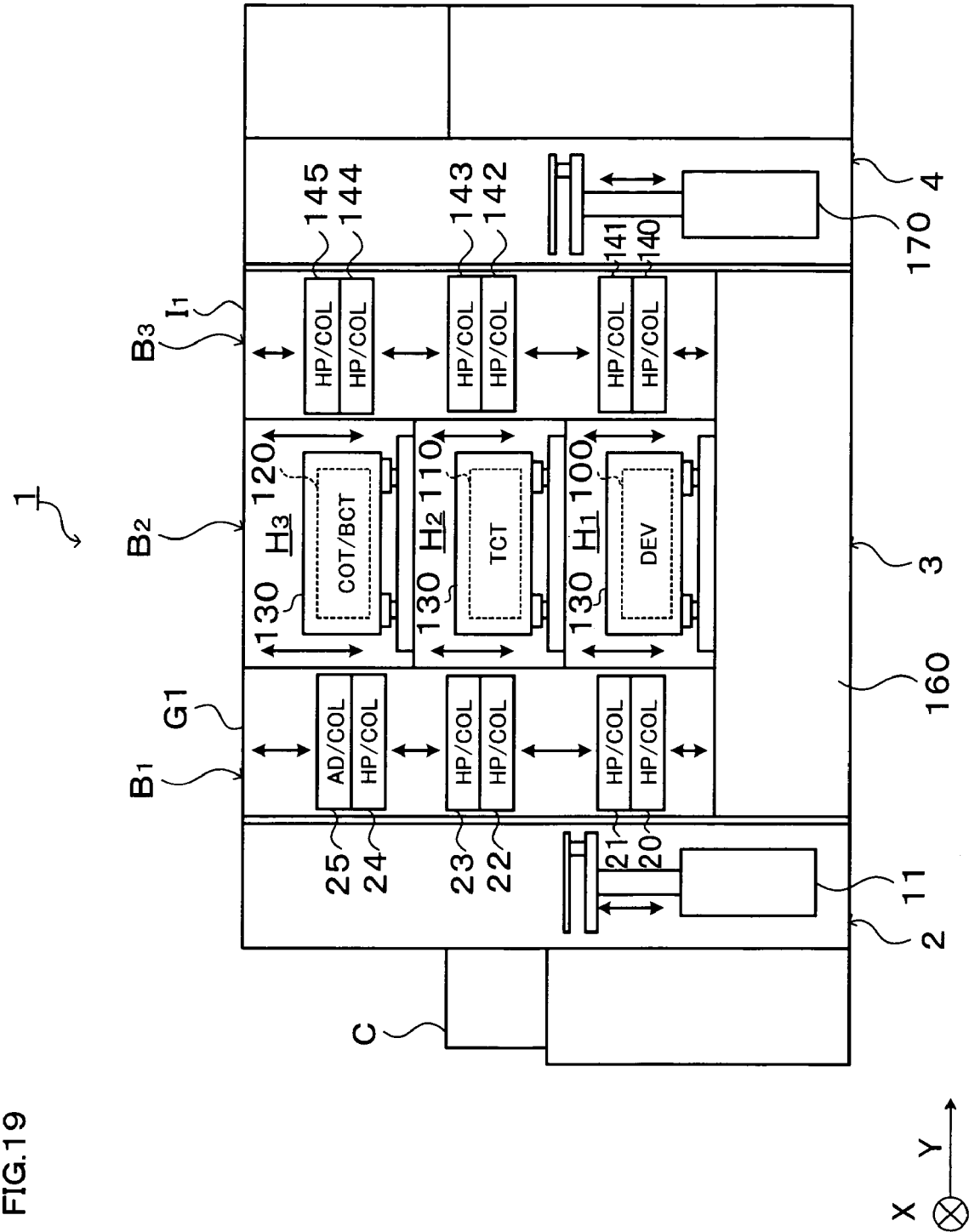
FIG. 19 is a side view showing a substrate processing system including the solution treatment units in the second block which can vertically move.

While the solution treatment units in the second block B2 described in the above embodiment can horizontally move, they may be able to vertically move. In this case, the base 131 of the housing 130 in each of the unit layers H1 to H3 is held, for example, by holding members 200 and attached to guides 201 extending in the vertical direction as shown in FIG. 18. The base 131 of the housing 130 can vertically move along the guides 201 by drive mechanisms 202. This allows the solution treatment units in the unit layers H1 to H3 to vertically move. When the wafer W is carried between the first block B1 and the second block B2 or between the second block B2 and the third block B3, the solution treatment units in the second block B2 are vertically moved as required as shown in FIG. 19. This configuration allows, for example, a larger number of thermal processing units in the first and third blocks B1 and B3 to access the solution treatment units in the second block B2, resulting in formation of a larger number of carriage routes of the wafer W.

Figure 20:
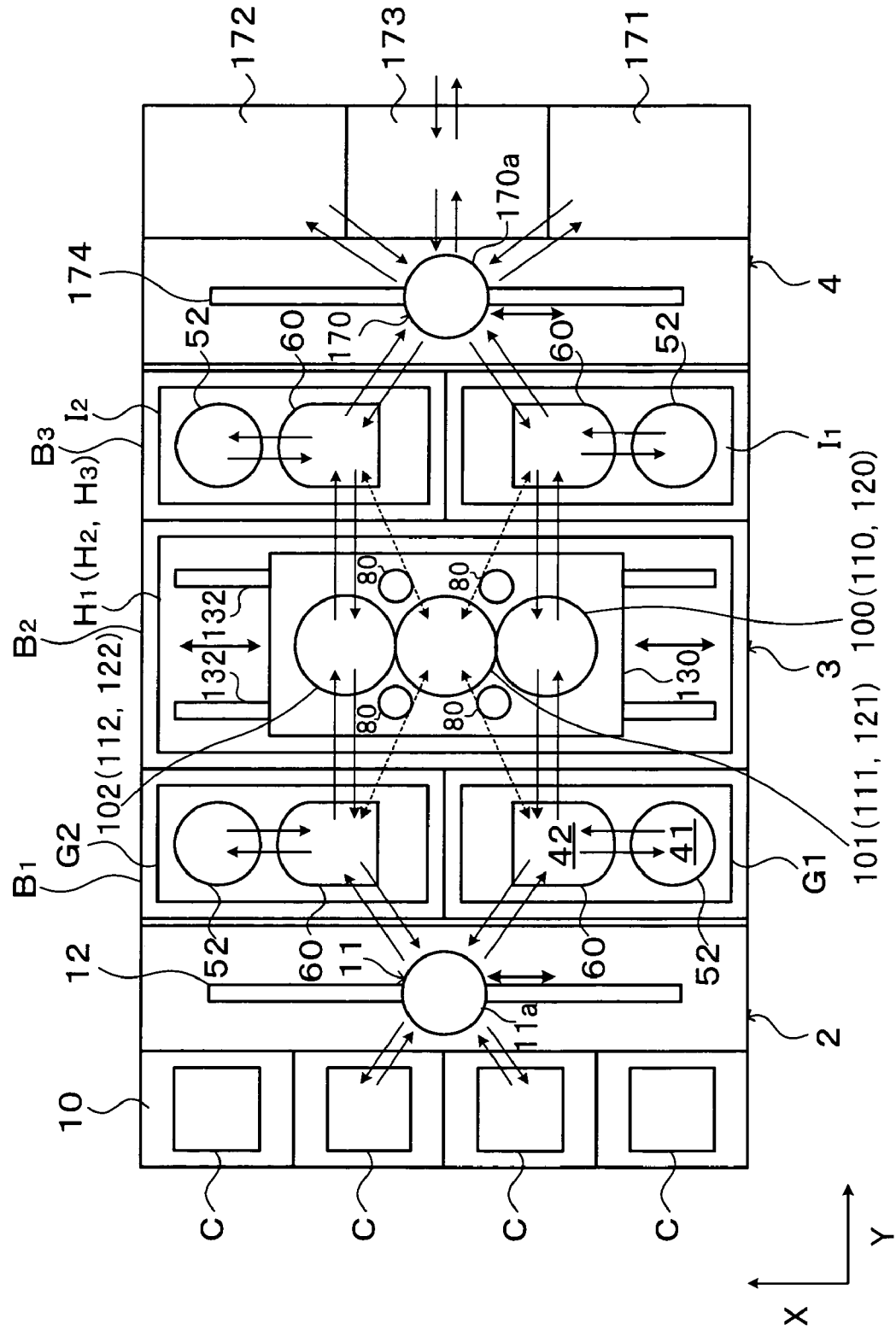
FIG. 20 is a plan view of a substrate processing system including carrier units in the second block.

While the carrier units 80 are provided in the thermal processing units in the first block B1 and the third block B3 in the above embodiment, carrier units 80 may be provided in the solution treatment units in the second block B2 as shown in FIG. 20. In this case, the carrier units 80 may not be provided on the first block B1 and third block B3 side. In this case, the carriage of the wafer W between the first block B1 and the second block B2 and between the second block B2 and the third block B3 can be performed by the carrier units 80 of the second block B2.

Note that the carrier units 80 may be provided in both the thermal processing units in the first block B1 and the third block B3 and in the solution treatment units in the second block B2. If the carrier units 80 are provided in the solution treatment units in the second block B2, the carrier units 80 may not be provided in all of the solution treatment units, but the carrier unit 80 may be provided only in a particular solution treatment unit. Further, similarly in the first block B1 and the third block B3 described in the above embodiment, the carrier units 80 may not be provided in all of the units, but the carrier unit 80 may be provided only in a particular unit.

Furthermore, the cooling plate 60 of the thermal processing unit may be provided with a carrier function and configured to be able to rotate so as to approach and retract to/from the solution treatment units in the second block B2 so that the cooling plate 60 can directly access the solution treatment units.

Figure 21:
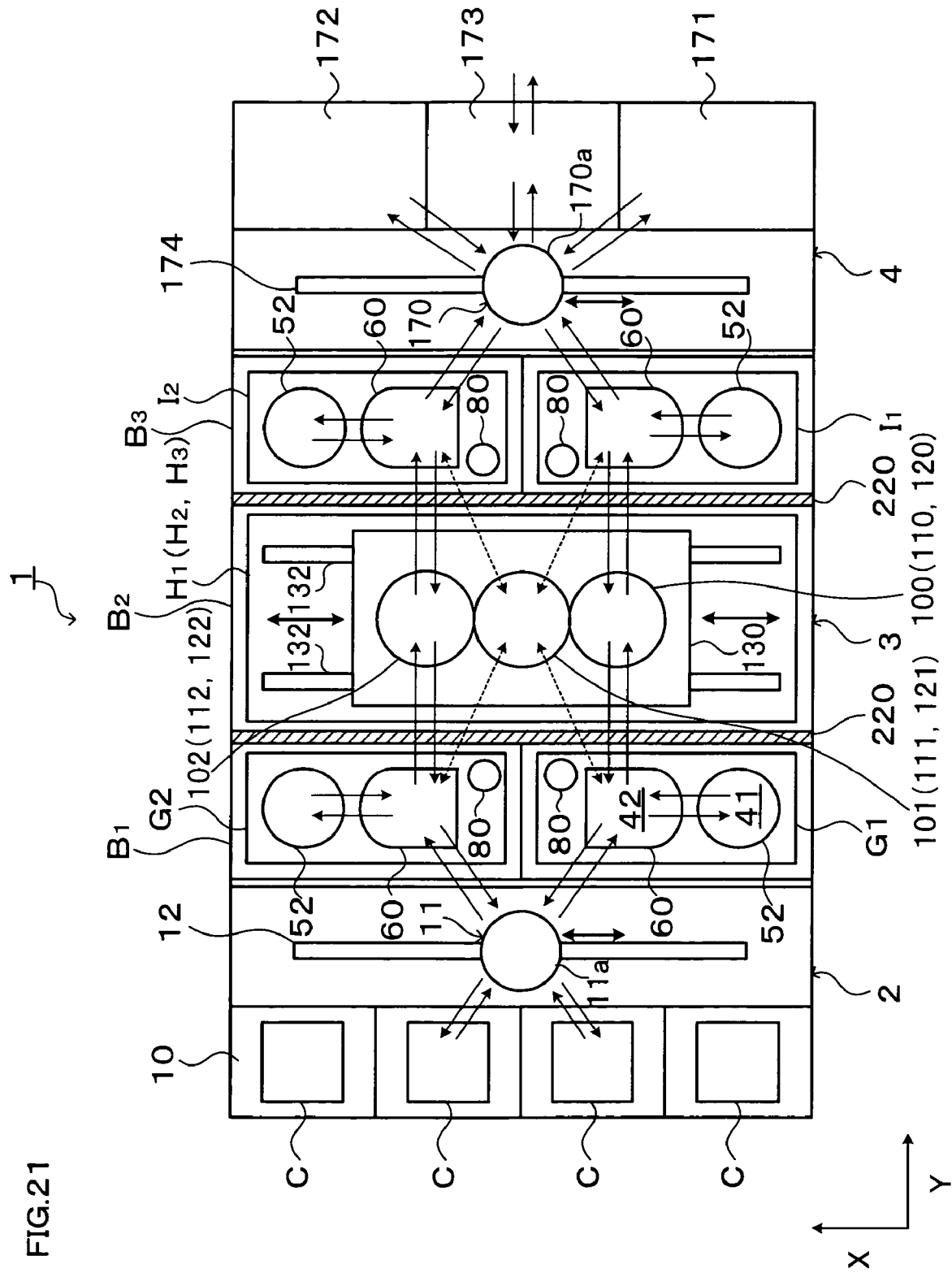
FIG. 21 is a plan view showing a configuration of a substrate processing system including partition panels.

Between the adjacent blocks in the processing station 2, partition panels 220 may be provided as shown in FIG. 21. In this case, the partition panel 220 has a heat-insulated structure of an air-cooling type or water-cooling type. This structure prevents the heat of the thermal processing units in the first and third blocks B1 and B3 from adversely affecting the solution treatment units in the second block B2. Note that the partition panel 220 is formed a not-shown wafer carry port. A shutter may be provided at the wafer carry port.

A preferred embodiment of the present invention has been described above, but the present invention is not limited to the embodiment. It should be understood that various changes and modifications are readily apparent to those skilled in the art within the spirit as set forth in claims, and those should also be covered by the technical scope of the present invention.

The carriage route of the wafer W is not limited to that in the above embodiment. For example, when only the resist film is formed with no antireflection film formed on the top of the resist film, the wafer W may be carried to the heating/cooling unit on the third block B3 side after the wafer W is coated with the resist in the resist coating unit 120, and then carried to the interface section 4 side as in the above embodiment.

On the other hand, when the antireflection film is formed under the resist film, the wafer W is carried from the cassette station 2 to the heating/cooling unit in the first block B1, and from that heating/cooling unit to the bottom coating unit 121 in the second block B2. The wafer W coated with the antireflection film in the bottom coating unit 121 is carried, for example, to the heating/cooling unit in the first block B1 and then carried to the resist coating unit in the second block B2 as in the above embodiment. The wafer W for which the resist coating treatment has been finished may be carried, for example, to the top coating unit 110 in the second block B2 via the heating/cooling unit in the first or third block B1 or B3, or carried to the heating/cooling unit in the third block B3 and to the interface section 4. In this manner, the carriage route of the wafer W can be arbitrarily selected according to the processing recipe for the wafer W.

Further, the carriage of the wafer W between the units in the first block B1 may be performed by the wafer carrier 11 in the cassette station 2. For example, an unprocessed wafer W may be carried by the wafer carrier 11 to the heating/cooling unit in the first block B1 and then carried by the wafer carrier 11 from that heating/cooling unit to the adhesion/cooling unit.

Further, the carriage of the wafer W between the units in the third block B3 may be performed by the wafer carrier 170 in the interface section 4.

While only the processing and treatment units for performing processing and treatment for the wafer W are provided in the processing station 3 described in the above embodiment, units performing no processing or treatment for the wafer W, for example, a transfer unit which transfers the wafer W and an alignment unit for performing alignment may be provided as necessary.

While the processing station 3 described in the above embodiment is composed of three blocks B1 to B3, the number of the blocks can be arbitrarily selected. The number of groups in the first and third blocks B1 and B3 can be arbitrarily selected. Further, the number of the unit layers in the second block B2 can also be arbitrarily selected.

While six thermal processing units are tiered in each of the unit groups in the first block B1 and the third block B3, the number and the kinds of the units can be arbitrarily selected. Further, while three solution treatment units are arranged in a line in each of the unit layers in the second block B2, the number and the kinds of the units can also be arbitrarily selected.

While the relative movement between the thermal processing units in the first and third blocks B1 and B3 and the solution treatment units in the second block B2 is realized by the vertical movement of the thermal processing units in the first and third blocks B1 and B3 and the horizontal movement of the solution treatment units in the second block B2 in the above embodiment, the relative movement may be realized by other movement. For example, the thermal processing units in the first and third blocks B1 and B3 may horizontally move. Further, the units in a predetermined block may move in a linearly diagonal direction to the movement destination.

While the processing process of one wafer W has been described in the above embodiment, processing is performed for a plurality of wafers continuously at the same time in the processing system 1. In this event, even when the wafer W is being performed in one solution treatment unit in the unit layer H1 to H3 in the second block B2, the housing 130 may move to carry the wafer W into/out of another solution treatment unit. Further, in the first block B1 and the second block B2, during the time when processing for the wafer W is being performed in one thermal processing unit of the thermal processing units in a pair, the whole thermal processing units in the pair may move to carry the wafer W to/from the other thermal processing unit.

The carriage route of the wafer W is not limited to that in the above embodiment. The carriage route of the wafer W can be arbitrarily selected according to the processing recipe for the wafer W. The carriage of the wafer W between the units in the first block B1 may be performed by the wafer carrier 11 in the cassette station 2. For example, an unprocessed wafer W may be carried by the wafer carrier 11 to the heating/cooling unit in the first block B1 and then the wafer W in that heating/cooling unit may be carried by the wafer carrier 11 to the adhesion/cooling unit. Further, the carriage of the wafer W between the units in the third block B3 may be performed by the wafer carrier 170 in the interface section 4.

Figure 22:
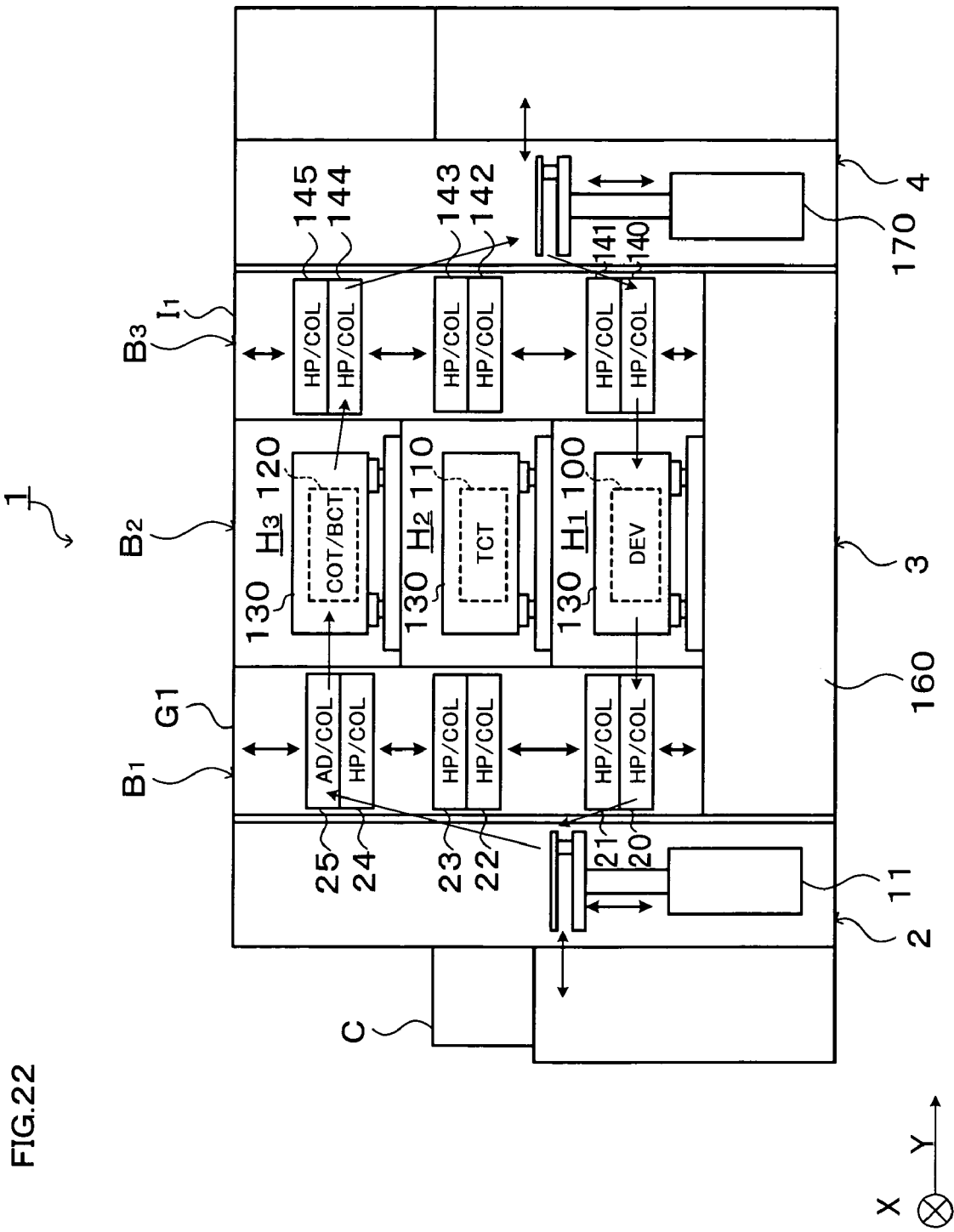
FIG. 22 is a side view showing the outline of a substrate processing system in FIG. 1 showing another carriage route.

Furthermore, a carriage route as shown in FIG. 22 may be employed. More specifically, for example, the wafer W carried into the resist coating unit 120 is coated with the resist solution. The wafer W is then carried from the resist coating unit 120, for example, to the heating/cooling unit 144 at the upper tier in the first unit group I1 in the third block B3 as shown in FIG. 22. Note that the wafer W may be carried to the other heating/cooling unit which can access the resist coating unit 120, for example, the heating/cooling unit 143 or 145 in the first unit group I1, or the heating/cooling unit 153 to 155 in the second unit group I2. Further, the wafer W may be carried to the heating/cooling unit in the third block B3 which is unoccupied at the point in time of carriage.

The carriage of the wafer W from the resist coating unit 120 to the heating/cooling unit 144 is performed by the carrier unit 80 of the heating/cooling unit 144. Further, if the carriage destination, for example, the heating/cooling unit 144 and the resist coating unit 120 are not aligned, the heating/cooling unit 144 and the resist coating unit 120 move relative to each other, whereby the heating/cooling unit 144 and the resist coating unit 120 are close to each other, and the wafer W is then carried by the carrier unit 80.

The wafer W carried, for example, to the heating/cooling unit 144 is carried from the cooling plate 60 to the heating plate 52 where the wafer W is pre-baked. The wafer W for which the pre-baking has been finished is returned to the cooling plate 60 and then carried by the wafer carrier 170 in the interface section 4, for example, to the edge exposure unit 171. In the edge exposure unit 171, the outer peripheral portion of the wafer W is exposed. Thereafter, the wafer W is carried by the wafer carrier 170 to the transfer cassette 173 and to the aligner (not shown) close to the interface section 4, where the wafer W is exposed.

The wafer W for which the exposure processing has been finished is returned to the transfer cassette 173 and carried by the wafer carrier 170 to the heating/cooling unit 140 at the lower tier side in the first block I1 in the third block B3. Note that the wafer W may be carried to the other heating/cooling unit 141, 150 or 151 in the third block B3 which can carry the wafer W to the developing treatment unit where the wafer is subjected to subsequent treatment. Further, the wafer W may be carried to the heating/cooling unit in the third block B3 which is unoccupied at the point in time of carriage.

Furthermore, the thermal processing units in the first block B1 and the third block B3 in the processing station 3 may be configured to be able to move in the vertical direction and the solution treatment unit in the second block B2 may be configured to be able to move in the horizontal direction. Further, the carrier units 80 may be provided in the thermal processing units in the first block B1 and the third block B3, and the units in the first block B1 and the units in the second block B2, and the units in the second block B2 and the units in the third block B3 may be moved relative to each other so as to allow the wafer W to be carried between the first block B1 and the second block B2 and between the second block B2 and the third block B3. This configuration allows the wafer W to be carried between the units in many combinations between the first block B1 and the second block B2. It becomes also possible that the wafer W is carried between the units in many combinations between the second block B2 and the third block B3. As a result of this, many carriage routes are formed in the processing station 3 to be able to flexibly deal with various processing recipes for the wafer W. Further, a central carrier unit as in the prior art is eliminated so that the carriage between the units is smoothly performed, thus reducing the processing time difference among the wafers W and the difference in carriage waiting time of the wafer W to uniformize the wafer processing and improve the throughput. In addition, a large space required for setting the central carrier unit is not necessary, so that the substrate processing system 1 can be accordingly decreased in size.

The units in the first and third blocks B1 and B3 vertically move and the units in the second block B2 sandwiched between them horizontally move so that a plurality of units moving in the vertical direction and a plurality of units moving in the horizontal direction are alternately arranged on the carriage route. This arrangement requires a reduced space required for the movement of the plurality of units in the processing station 3 so as to make the processing station 3 compact in size.

According to the above embodiment, the wafer W is carried from the cassette station 2 to the thermal processing unit in the first block B1, from the thermal processing unit in the first block B1 to the solution treatment unit in the second block B2, and then to the thermal processing unit in the third block B3 and to the interface section 4. After the exposure processing is finished, the wafer W is carried from the interface section 4 to the thermal processing unit in the third block B3, from the thermal processing unit in the third block B3 to the solution treatment unit in the second block B2, and then to the thermal processing unit in the first block B1 and returned to the cassette station 2. The wafer W is linearly carried in this manner, so that the total moving distance of the wafer W is reduced to improve the throughput.

Furthermore, the wafer W for which the exposure processing has been finished may be returned to the transfer cassette 173 and carried by the wafer carrier 170, for example, to the heating/cooling unit 140 in the third block B3. In the heating/cooling unit 140, the wafer W is subjected to post-exposure baking. The wafer W for which the post-exposure baling has been finished is carried by the carrier unit 80, for example, to the developing treatment unit 100 in the second block B2 and developed. The wafer W for which the developing treatment has been finished is carried, for example, to the heating/cooling unit 20 in the first block B1. The wafer W carried to the heating/cooling unit 20 is carried from the cooling plate 60 to the heating plate 52 and subjected to post-baking unit. The wafer W for which the post-baking has been finished is returned to the cooling plate 60 and returned to the cassette C by the wafer carrier 11 in the cassette station 2. Thus, a series of processes of photolithography end.

According to this embodiment, the wafer W carried from the cassette station 2 to the first block B1 is reciprocated between the first block B1 and the second block B2, and then carried to the third block B3 and to the interface section 4. In this manner, the wafer W is reciprocated between the first block B1 and the second block B2 as necessary, thereby ensuring that the wafer processing having a large number of steps can be performed while the wafer W is kept carried on a straight line with a shorter carriage distance. Note that the number of reciprocations of the wafer W can be arbitrarily selected according to the processing recipe for the wafer W.

The wafer W may be reciprocated between the first block B1 and the second block B2, and the wafer W may be reciprocated between the second block B2 and the third block B3 as necessary. While the wafer W for which the resist coating has been finished in the resist coating unit 120 is carried to the top coating unit 110 via the thermal processing unit in the first block B1 in the above-described embodiment, the wafer W may be carried to the top coating unit 110 via the thermal processing unit in the third block B3.

Alternatively, the wafer W may be reciprocated both between the first block B1 and the second block B2 and between the second block B2 and the third block B3. For example, when the antireflection films are formed at the bottom and the top of the resist film respectively, the wafer W is carried from the cassette station 2 to the heating/cooling unit in the first block B1 and then from that heating/cooling unit to the bottom coating unit 121 in the second block B2. The wafer W coated with the antireflection film in the bottom coating unit 121 is carried, for example, to the heating/cooling unit in the first block B and then carried, for example, to the resist coating unit 120 in the second block B2. Thereafter, the wafer W for which the resist coating has been finished in the resist coating unit 120 is carried, for example, to the top coating unit 110 in the second block B2 via the heating/cooling unit in the third block B3. The wafer W is then carried, for example, to the heating/cooling unit 142 in the third block B3 as in the above-described embodiment.

The wafer W may be reciprocated when the wafer W is carried from the cassette station 2 to the interface section 4, or the wafer W may be reciprocated between the third block B3 and the second block B2 or between the second block B2 and the first block B1 as necessary when the wafer W is carried from the interface section 4 to the cassette station 2.

While a plurality of units are arranged in each of the blocks in the processing station 3 in the above embodiment, the arrangement of the plurality of units in the present invention is not limited to that. While the present invention is applied to the substrate processing system 1 which performs photolithography process, the present invention may be applied to substrate processing systems for performing other processing, for example, washing treatment for performing washing treatment for the wafer W, film-forming processing for forming a film on the wafer W, etching treatment for etching the wafer W, and inspection processing for inspecting the film thickness, the line width, particles or defects on the wafer W. In other words, the units of the present invention may be a washing unit, a film-forming unit, an etching unit, an inspection unit, and the like. The present invention is also applicable to a processing system for other substrates such as an FPD (Flat Panel Display), a mask reticle for a photomask, and the like other than the wafer W.

The present invention is useful in flexibly dealing with various processing recipes, reducing the processing time difference among substrates and the carriage waiting time of the substrate, and reducing the space.

What is claimed is:

1. A substrate processing system for performing processing for a substrate, comprising:
   a plurality of first units capable of accommodating the substrate and a second unit, the substrate being carried between said second unit and said first unit close thereto,
   wherein said first units and said second unit are arranged side by side in a plan view,
   wherein at least one of said plurality of first units comprises a processing unit for performing processing for the substrate,
   wherein said plurality of first units are arranged in a line in the vertical direction, and
   wherein at least two first units adjacent to each other in the vertical direction of said plurality of first units are movable in the vertical direction to be able to transfer the substrate to/from said second unit.

2. A substrate processing system for performing processing for a substrate, comprising:
   a plurality of first units capable of accommodating the substrate and a second unit, the substrate being carried between said second unit and said first unit close thereto,
   wherein said first units and said second unit are arranged side by side in a plan view,
   wherein at least one of said plurality of first units comprises a processing unit for performing processing for the substrate,
   wherein said plurality of first units are arranged in a line in the horizontal direction, and
   wherein at least two first units adjacent to each other in the horizontal direction of said plurality of first units are movable in the horizontal direction to be able to transfer the substrate to/from said second unit.

3. The substrate processing system as set forth in claim 2, wherein said at least two first units adjacent to each other in the horizontal direction of said plurality of first units are integrally movable in the horizontal direction.

4. The substrate processing system as set forth in claim 3, wherein where N (N is a natural number of two or greater) first units are integrated, said integrated first units are movable in the horizontal direction by a space corresponding to N−1 units.

5. The substrate processing system as set forth in claim 2, wherein said plurality of first units are movable in the horizontal direction independently of each other.

6. The substrate processing system as set forth in claim 2, wherein said first unit is movable in the horizontal direction by a space corresponding to at least one unit.

7. The substrate processing system as set forth in claim 2, wherein said first unit is movable in the horizontal direction within a space corresponding to one unit.

8. The substrate processing system as set forth in claim 2, wherein said first units are movable in the horizontal direction such that, to a position of a substrate carry port of one of said first units which is capable of carrying the substrate to/from said second unit, a substrate carry port of at least another first unit adjacent to said one of said first units is able to be moved.

9. The substrate processing system as set forth in claim 2, wherein a plurality of said second units are provided and arranged in a line in the horizontal direction, and
wherein said first units are movable in the horizontal direction such that each of said first units is able to transfer the substrate to/from at least two of said second units adjacent to each other in the horizontal direction.

10. The substrate processing system as set forth in claim 2, wherein said first units comprise a solution treatment unit for performing a solution treatment for the substrate, and
wherein said second unit comprises a thermal processing unit for performing thermal processing for the substrate.

11. A substrate processing system for performing processing for a substrate, comprising:
a first unit and a second unit each capable of accommodating the substrate,
wherein at least either a plurality of said first units or a plurality of said second units are provided,
wherein at least one of said first unit(s) or said second unit(s) comprises a processing unit for performing processing for the substrate,
wherein at least one of said first unit(s) or said second unit(s) is provided with a carrier unit for carrying the substrate between said first unit and said second unit, and
wherein at least one of said first unit(s) or said second unit(s) moves to allow the substrate to be carried by said carrier unit.

12. The substrate processing system as set forth in claim 11, further comprising:
a plurality of third units or a single third unit capable of accommodating the substrate,
wherein the substrate is carried between said third unit and said second unit,
wherein if said second unit in provided with said carrier unit, at least either said second unit or said third unit moves to allow the substrate to be carried between said second unit and said third unit by said carrier unit,
wherein if said second unit is not provided with said carrier unit, said third unit is provided with another carrier unit for carrying the substrate between said second unit and said third unit, and at least either said second unit or said third unit moves to allow the substrate to be carried between said second unit and said third unit by said other carrier unit.

13. A substrate processing system for performing processing for a substrate, comprising:
a processing station including a plurality of first units, a plurality of second units, and a plurality of third units arranged in this order which are capable of accommodating the substrate,
wherein at least one of said first units, said second units, and said third units comprises a processing unit for performing processing for the substrate,
wherein each of said first units is vertically movable,
wherein each of said second units is horizontally movable,
wherein each of said third units is vertically movable, and
wherein at least one of said first units, said second units, and said third units moves to allow the substrate to be transferred between at least one of said first units and at least one of said second units, and between at least one of said second units and at least one of said third units.

* * * * *